(12) United States Patent
Ishida et al.

(10) Patent No.: US 11,262,576 B2
(45) Date of Patent: Mar. 1, 2022

(54) REFLECTIVE OPTICAL ELEMENT

(71) Applicant: Panasonic Intellectual Property Management Co., Ltd., Osaka (JP)

(72) Inventors: Takami Ishida, Osaka (JP); Kazuki Komaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 145 days.

(21) Appl. No.: 16/648,264

(22) PCT Filed: Oct. 25, 2018

(86) PCT No.: PCT/JP2018/039655
§ 371 (c)(1),
(2) Date: Mar. 18, 2020

(87) PCT Pub. No.: WO2019/087919
PCT Pub. Date: May 9, 2019

(65) Prior Publication Data
US 2020/0241286 A1    Jul. 30, 2020

(30) Foreign Application Priority Data

Oct. 31, 2017 (JP) .............................. JP2017-210808

(51) Int. Cl.
*G02B 26/08* (2006.01)
*G02B 26/10* (2006.01)
(Continued)

(52) U.S. Cl.
CPC ....... *G02B 26/0858* (2013.01); *G02B 26/101* (2013.01); *H02N 2/028* (2013.01); *H01L 41/1876* (2013.01)

(58) Field of Classification Search
CPC .............. G02B 26/0858; G02B 26/101; G02B 26/105; H02N 2/028; H01L 41/1876; B81B 3/00
(Continued)

(56) References Cited

U.S. PATENT DOCUMENTS

2010/0296147 A1    11/2010    Terada et al.
2015/0116805 A1    4/2015    Kojima et al.
2017/0199375 A1*    7/2017    Naono ................. G02B 26/105

FOREIGN PATENT DOCUMENTS

CN    104570334    4/2015
JP    2009-244602    10/2009

OTHER PUBLICATIONS

International Search Report of PCT application No. PCT/JP2018/039655 dated Jan. 15, 2019.
(Continued)

*Primary Examiner* — Euncha P Cherry
(74) *Attorney, Agent, or Firm* — McDermott Will & Emery LLP

(57) ABSTRACT

A reflective optical element includes a reflector configured to reflect light, a first connection part connected with the reflector, first and second transmission parts connected with of the first connection part, first and second vibrator parts connected with respective base ends of the first and second transmission parts, first and second driver parts connected with respective head ends of the first and second vibrator parts, a base, and a second connection part connecting the first and second vibrator parts vibratably with the base.

13 Claims, 5 Drawing Sheets

(51) Int. Cl.
 *H02N 2/02* (2006.01)
 *H01L 41/187* (2006.01)
(58) Field of Classification Search
 USPC .................................................. 359/199.4
 See application file for complete search history.

(56) References Cited

OTHER PUBLICATIONS

English Translation of Chinese Office Action dated Sep. 3, 2021 for the related Chinese Patent Application No. 201880069405.7.

* cited by examiner

REFLECTIVE OPTICAL ELEMENT

CROSS-REFERENCE TO RELATED APPLICATIONS

This application is a U.S. national stage application of the PCT international application No. PCT/JP2018/039655 filed on Oct. 25, 2018, which claims the benefit of foreign priority of Japanese patent application No. 2017-210808 filed on Oct. 31, 2017, the contents all of which are incorporated herein by reference.

TECHNICAL FIELD

The present invention relates to a reflective optical element configured to reciprocally move a position irradiated with light by reflecting the light.

BACKGROUND ART

PTL 1 discloses a conventional reflective optical element configured to reciprocally move a position irradiated with laser light. The reflective optical element includes a reflector to reflect laser light, a connection part connected with the reflector, two vibrator bodies having arm shapes extending in directions which intersect a rotation axis of the reflector, and driver bodies to vibrate the vibrator bodies, respectively. The connection part per se twists and causes the reflector to rotationally swing. The vibrator bodies cause the connection part to reciprocally twist. Each of driver bodies includes, e.g. a piezoelectric element that vibrates respective one of the vibrator bodies.

CITATION LIST

Patent Literature

PTL 1: Japanese Patent Laid-Open Publication No. 2009-244602

SUMMARY

A reflective optical element includes a reflector configured to reflect light, a first connection part connected with the reflector, first and second transmission parts connected with of the first connection part, first and second vibrator parts connected with respective base ends of the first and second transmission parts, first and second driver parts connected with respective head ends of the first and second vibrator parts, a base, and a second connection part connecting the first and second vibrator parts vibratably with the base.

DETAIL DESCRIPTION OF PREFERRED EMBODIMENTS

Exemplary embodiments of a reflective optical element according to the present disclosure will be described with reference to the drawings. It should be noted, however, that each of the exemplary embodiments described below shows a preferable or specific example of the present disclosure. Features such as numerical values, shapes, materials, constituent elements, and arrangement positions and coupling modes of the constituent elements, steps, and orders of the steps shown in the following embodiments are mere examples, and therefore are not intended to impose any limitation on the present disclosure. Moreover, of the constituent elements in the following embodiments, constituent elements not recited in any one of the independent claims which define the most generic concept of the invention are described as optional constituent elements.

Moreover, the drawings are schematic views to which enhancement, omission, and ratio adjustment have been made as appropriate in order for the drawings to illustrate the present disclosure, and thus show shapes, positional relationships, and ratios that may differ from actual ones.

Exemplary Embodiment 1

Figure 1:
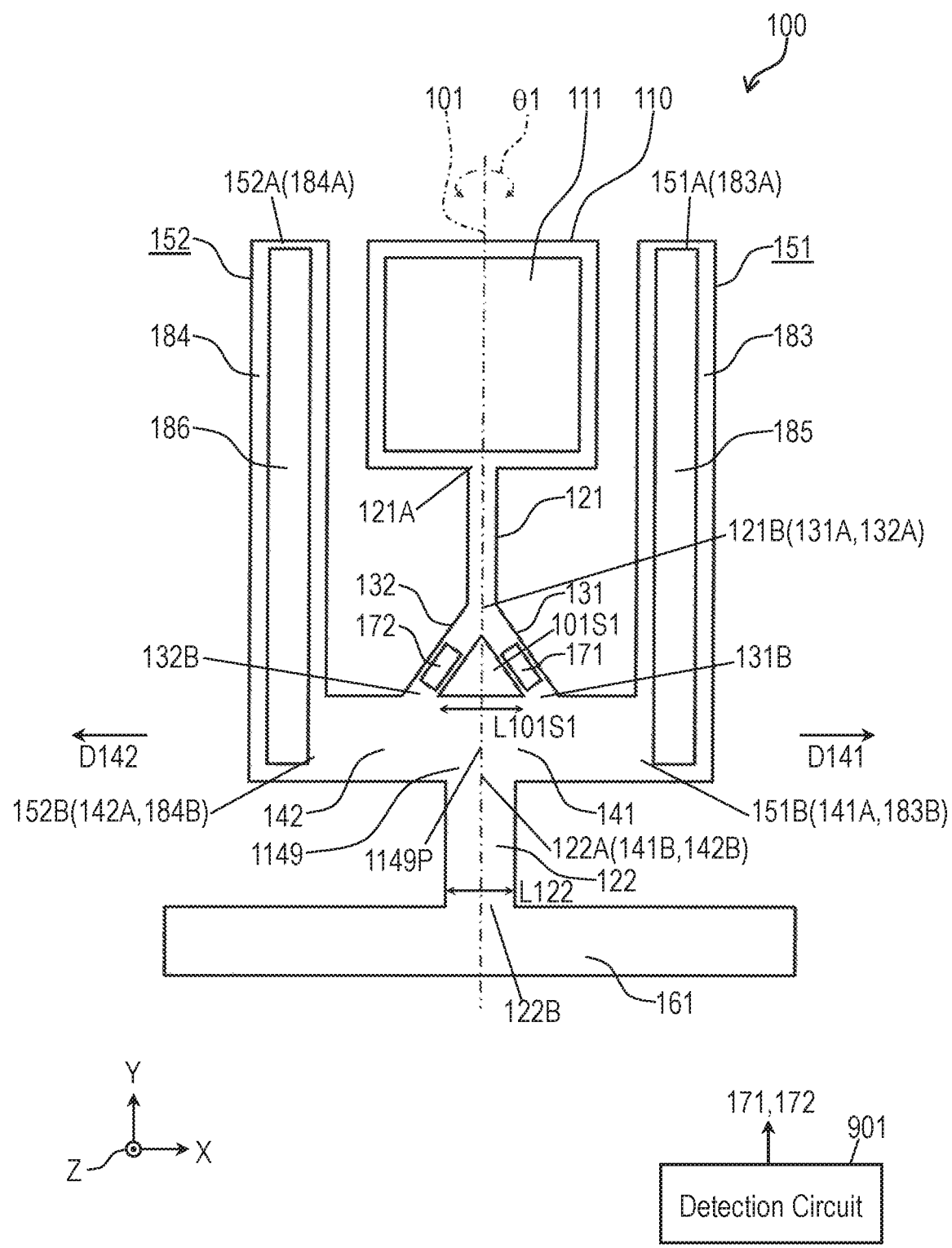
FIG. 1 is a plan view of a reflective optical element according to Exemplary Embodiment 1.
Figure 2:
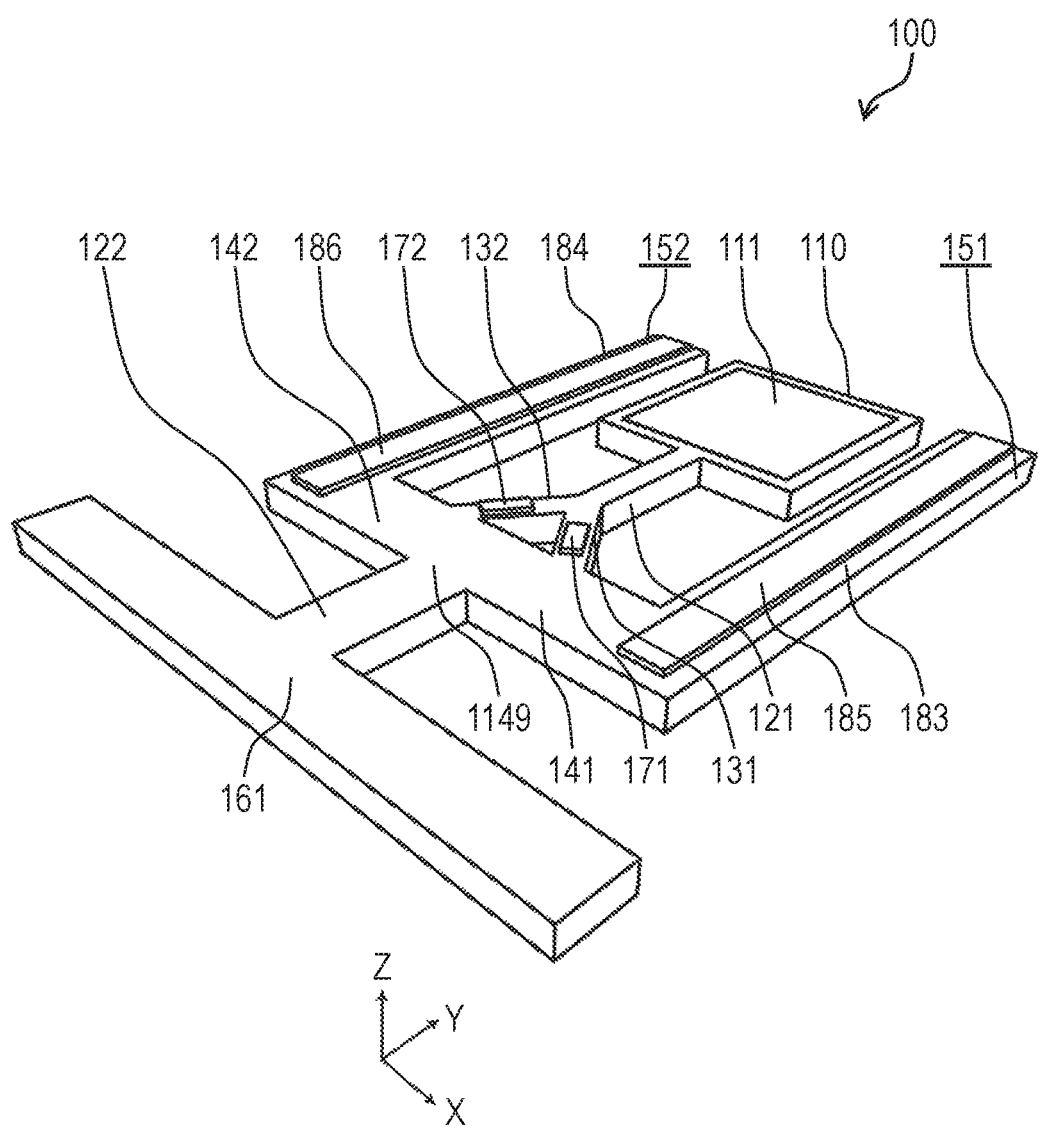
FIG. 2 is a perspective view of the reflective optical element according to Embodiment 1.

FIG. 1 is a plan view of reflective optical element 100 according to Exemplary Embodiment 1. FIG. 2 is a perspective view of reflective optical element 100 according to Embodiment 1.

Reflective optical element 100 periodically changes the reflection angle of light, such as laser light, thereby periodically scanning the position irradiated with the light. Reflective optical element 100 includes reflector 110, connection parts 121 and 122, transmission parts 131 and 132, vibrator parts 141 and 142, driver parts 151 and 152, and base 161. In accordance with the embodiment, a part of reflector 110, the connection parts, the transmission parts, parts of the vibrator parts, and the base are unitarily formed by removing unwanted portions from a single substrate. For example, etching technology commonly applied in processes for manufacturing semiconductors can be used to remove such unwanted portions from a silicon substrate, thereby unitarily forming the part of reflector 110, the connection parts, the transmission parts, the parts of the vibration parts, and the base. Reflective optical element 100 is a so-called micro electro mechanical systems (MEMS) element. Reflective optical element 100 further includes monitor elements 171 and 172.

Connection parts 121 and 122 have head ends 121A and 122A and base ends 121B and 122B, respectively, and extend from head ends 121A and 122A to base ends 121B and 122B, namely from base ends 121B and 122B to head ends 121A and 122A, respectively. Transmission parts 131 and 132 have head ends 131A and 132A and base ends 131B and 132B, respectively, and extend from head ends 131A and 132A to base ends 131B and 132B, namely from base ends 131B and 132B to head ends 131A and 132A, respectively. Vibrator parts 141 and 142 have head ends 141A and 142A and base ends 141B and 142B, respectively, and extend from head ends 141A and 142A to base ends 141B and 142B, namely from base ends 141B and 142B to head ends 141A and 142A, respectively. Driver parts 151 and 152 have head ends 151A and 152A and base ends 151B and 152B, respectively, and extend from head ends 151A and 152A to base ends 151B and 152B, namely from base ends 151B and 152B to head ends 151A and 152A, respectively.

While the material of the substrate is not particularly limited, the substrate is preferably made of material, such as metal, crystalline material, glass, or resin, preferably having high mechanical strength and high Young's modulus. Such a material includes silicon, titanium, stainless steel, elinvar, brass, and other metals and alloys thereof. The material including the aforementioned metals or alloys provides reflective optical element 100 with preferable vibration characteristics and processability.

Reflector 110 is configured to reflect light while vibrating reciprocally and rotationally about rotation axis 101. While the shape of reflector 110 is not particularly limited, the reflector according to the embodiment has a rectangular plate shape having reflection surface 111 capable of reflecting light with high reflectivity. The material of reflection surface 111 may be appropriately selected. Examples of the material include metals, such as gold, silver, copper, and aluminum, metallic compounds, and dielectric multilayers containing silicon dioxide, titanium dioxide, etc. Reflection surface 111 may include plural layers. Reflection surface 111 may be formed by smoothing the surface of reflector 110 by polishing. Reflection surface 111 may be flat but may be curved.

Connection part 121 is disposed along rotation axis 101, and head end 121A of the connection part is connected with reflector 110 to hold reflector 110. Connection part 121 transmits, to reflector 110, torque for rotationally swinging reflector 110. Connection part 121 is twisted about rotation axis 101 by angle θ1 causes reflector 110 to rotationally swing by angle θ1 while holding reflector 110.

While the shape of connection part 121 is not particularly limited, the connection part has a thin rod shape with a narrower width (length in the X-axis direction in the figures) than that of reflector 110 because of its twistability, thereby causing reflector 110 to rotationally swing. Connection part 121 has a rectangular cross-section perpendicular to rotation axis 101. Connection part 121 has the same thickness as reflector 110 and other portions. Connection part 121 has the same cross-section over a region from reflector 110 to transmission parts 131 and 132, that is, from head end 121A to base end 121B. In this way, the connection part has a uniform shape and uniform cross-sectional area along rotation axis 101. This configuration allows connection part 121 to twist uniformly as a whole when driving reflective optical element 100, thereby preventing connection part 121 from being broken due to concentration of stress.

These constituent elements do not necessarily have the same thickness. For example, reflector 110 may be preferably thicker than connection part 121 and transmission part 131, thereby preferably reducing strains on the surface of reflector 110. Base 161 may be preferably thicker than other portions, thereby allocating spaces in the Z-axis direction which are necessary for the driving of driver parts 151 and 152 and reflector 110, e.g. in cases where reflective optical element 100 is mounted on a flat surface of other product. Such a thicker base preferably increases the structural strength of the entire of reflective optical element 100.

The phrase, "along rotation axis 101" means not only that connection part 121 extends straight along the axis as described according to the embodiment, but also that the connection part extends substantially along a virtual straight line, i.e. rotation axis 101, for example, that connection part 121 is curved meanderingly or bent in a zigzag.

Transmission parts 131 and 132 transmit, to connection part 121, vibrations of vibrator parts 141 and 142 as torque. Head end 131A of transmission part 131 is connected with base end 121B of connection part 121 opposite to reflector 110 while base end 131B thereof is connected with vibrator part 141. Transmission part 131 intersects rotation axis 101, extends from head end 131A away from rotation axis 101, and intersects vibrator part 141. Transmission part 132 is located on the opposite side of transmission part 131 with respect to a virtual plane which includes rotation axis 101 and which is perpendicular to the surface of reflector 110. Head end 132A of transmission part 132 is connected with base end 121B of connection part 121 opposite to reflector 110, and base end 132B thereof is connected with vibrator part 142. Transmission part 132 intersects rotation axis 101, extends from head end 132A away from rotation axis 101, and intersects vibrator part 142.

In accordance with the embodiment, transmission part 131 and transmission part 132 are disposed in rotational symmetry about rotation axis 101 in which if one of them is rotated at 180 degrees about rotation axis 101 it becomes identical to the other; therefore, they are disposed in line symmetry. Transmission part 131 has a straight rod shape which extends from base end 121B of connection part 121 to vibrator part 141, that is, from head end 131A to base end 131B of transmission part 131. Transmission part 132 has a straight rod shape which extends from base end 121B of connection part 121 to vibrator part 142, that is, from head end 132A to base end 132B of transmission part 132. Opening 101S1 (space) containing rotation axis 101 is provided between transmission part 131 and transmission part 132. Opening 101S1 is located on rotation axis 101. In the case where transmission parts 131 and 132 have rod shapes extending on a straight line, transmission parts 131 and 132 efficiently transmit, to connection part 121, vibrations of vibrator parts 141 and 142 as torque.

A conventional reflective optical element disclosed in PTL 1 has advantages over other reflective optical elements which are each equipped with a polygon mirror rotated with a motor. The advantages are in that the conventional element is small in size and weight, and needs less electric power to rotationally vibrate its reflector. However, as for a deflection angle that indicates an allowable range of rotational vibration, the deflection angle with the conventional reflective optical element is narrow. This configuration narrows the irradiation range with laser light reflected on the element.

In contrast, as described above, reflective optical element 100 according to the embodiment efficiently transmits, to connection part 121, vibrations of vibrator parts 141 and 142 as torque.

The angle of the direction in which each of transmission parts 131 and 132 extends with respect to rotation axis 101 may be selected in the range from not less than 15 degrees to not larger than 80 degrees with respect to rotation axis 101. Transmission parts 131 and 132 may not necessarily have the straight shapes but may have curved or bent shapes.

The terms "intersect" used in the embodiment means situations not only where two lines crossing in contact with each other, but also where two lines make a grade-separated crossing without contact with each other.

Vibrator parts 141 and 142 are arm-shaped members which vibrate in circumferential directions about rotation axis 101, thereby generating torque for rotationally swinging reflector 110. The vibrator parts extend in respective intersecting directions D141 and D142 that intersect rotation axis 101. Vibrator part 141 is disposed on a same side of transmission part 131 with respect to rotation axis 101 in intersecting direction D141 that intersects with rotation axis 101, and is connected with base end 131B of transmission part 131. Vibrator part 142 is disposed on the opposite side of transmission parts 131 with respect to rotation axis 101 in intersecting direction D142 that intersects rotation axis 101, and is connected with base end 132B of transmission part 132.

In accordance with the embodiment, vibrator part 141 has a rectangular rod shape that extends in a direction perpendicular to rotation axis 101. Vibrator part 142 has a rectangular rod shape that extends in a direction which is opposite to vibrator part 141 and which perpendicularly intersects rotation axis 101.

Base end 141B of vibrator part 141 is connected with base end 142B of vibrator part 142 unitarily at connection position 1149P on connection portion 1149. Vibrator parts 141 and 142 have a straight rod shapes that extends from rotation axis 101 in directions perpendicularly to rotation axis 101. Base end 131B of transmission part 131 is connected with vibrator part 141 at a position between connection portion 1149 and driver part 151, that is, at the position between head end 141A and base end 141B of the vibrator part. Base end 132B of transmission part 132 is connected with vibrator part 142 at a position between connection portion 1149 and driver part 152, that is, at the position between head end 142A and base end 142B of the vibrator part. Both at least a part of the coupling portion of transmission part 131 and vibrator part 141 and at least a part of the coupling portion of transmission part 132 and vibrator part 142, are each preferably disposed on the outer side than connection part 122 in the X-axis direction, that is, they are each preferably farther away from rotation axis 101 than the contour of connection part 122. This configuration allows vibrations of vibrator parts 141 and 142 to be effectively transmitted to transmission parts 131 and 132. In accordance with the embodiment, the whole of each of the coupling portions at which transmission parts 131 and 132 are respectively connected with vibrator parts 141 and 142, is disposed on the outer side than connection part 122, that is, the whole is farther away from rotation axis 101 than the contour of connection part 122. That is, width L101S1 of opening 101S1 in a direction perpendicular to rotation axis 101 is equal to the separation between base end 131B of transmission part 131 and base end 132B of transmission part 132, and is larger than width L122 of connection part 122 in the direction perpendicular to rotation axis 101. Width L101S1 of opening 101S1 in the direction perpendicular to rotation axis 101 includes width L122 of connection part 122 in the direction perpendicular to rotation axis 101.

Reflective optical element 100 according to Embodiment 1 includes a so-called tuning-fork vibrator including vibrator part 141 and driver part 151 which are connected with each other, vibrator part 142 and driver part 152 which are connected with each other, and coupling part 1149 which connects base end 141B of vibrator part 141 with base end 142B of vibrator part 142 at connection position 1149P. This tuning-fork vibrator generates a drive vibration, thereby producing torque to rotate reflector 110. In the tuning-fork vibrator described above, coupling part 1149 allows vibrator part 141 connected with driver part 151 to be rigidly secured to vibrator part 142 connected with driver part 152, thereby providing driver parts 151 and 152 and vibrator parts 141 and 142 with a tuning-fork vibration with a high Q-value. This configuration provides a stable drive vibration (torque) generated in transmission parts 131 and 132 and connection part 121.

In cases where a cut-out portion is formed between base end 141B of vibrator part 141 and base end 142B of vibrator part 142, and where coupling part 1149 does not couple vibrator part 141 with vibrator part 142, the tuning-fork vibrator for ideal drive is hardly excited. This results in a decrease in the Q-value, leading to unstable drive.

Driver parts 151 and 152 generate drive forces that cause head ends 141A and 142A of vibrator parts 141 and 142 to vibrate, respectively, in circumferential directions about rotation axis 101. Driver part 151 is connected with head end 141A of vibrator part 141, and causes vibrator part 141 to vibrate in the circumferential directions about rotation axis 101, which in turn causes, via transmission part 131, connection part 121 to vibrate rotationally about rotation axis 101. Driver part 152 is connected with head end 142A of vibrator part 142, and causes vibrator part 142 to vibrate in the circumferential directions about rotation axis 101, which in turn causes, via transmission part 132, connection part 121 to swing rotationally about rotation axis 101.

In accordance with the embodiment, base end 151B of driver part 151 is connected unitarily with head end 141A of vibrator part 141, and driver part 151 includes driver body 183 extending along rotation axis 101 toward reflector 110. Driver body 183 has a rod shape with a rectangular cross-ssection. Driver body 183 has head end 183A and base end 183B, and extends from head end 183A to base end 183B, namely from base end 183B to head end 183A. Head end 151A and base end 151B of driver part 151 are identical to head end 183A and base end 183B of driver body 183, respectively. Piezoelectric element 185 having a slender plate shape is disposed on the surface of driver body 183 along rotation axis 101. A voltage periodically changing varying applied to piezoelectric element 185 causes piezoelectric element 185 to expand and contract repetitively and alternately. In response to the expansion and contraction of piezoelectric element 185, driver body 183 (driver part 151) bends and recovers repetitively. Driver body 183 (driver part 151) drastically vibrates head end 183A protruding more largely than base end 183B connected with vibrator part 141. Then, vibration energy of the whole of driver body 183 (driver part 151) is transmitted to head end 141A of vibrator part 141.

Similarly to driver part 151, driver part 152 includes driver body 184 and piezoelectric element 186, and is disposed at a position symmetrical to driver part 151 with respect to the virtual plane which contains rotation axis 101 and which perpendicularly intersects the surface of reflector 110. Driver part 152 operates similarly to driver part 151.

That is, base end 152B of driver part 152 is connected unitarily with head end 142A of vibrator part 142, and driver part 152 includes driver body 184 extending along rotation axis 101 toward reflector 110. Driver body 184 has a rod shape with a rectangular cross-section. Driver body 184 includes head end 184A and base end 184B, and extends from head end 184A to base end 184B, namely from base end 184B to head end 184A. Head end 152A and base end 152B of driver part 152 are identical to head end 184A and base end 184B of driver body 184, respectively. Piezoelectric element 186 having a slender plate shape is disposed on the surface of driver body 184 and along rotation axis 101. A voltage which periodically changes and which is applied to piezoelectric element 186 causes piezoelectric element 186 to repetitively expand and contract repetitively. In response to the expansion and contraction of piezoelectric element 186, driver body 184 (driver part 152) repetitively bends and recovers accordingly. Head end 184A which protrudes more largely than base end 184B connected with vibrator part 142 vibrates more greatly than base end 184B. Then, vibration energy of the entire of driver part 152 is transmitted to head end 142A of vibrator part 142.

In accordance with the embodiment, each of piezoelectric elements 185 and 186 is a thin-film laminated piezoelectric actuator which is formed on the surface of corresponding one of drive bodies 183 and 184. The actuator has a laminated body structure including electrodes and a piezoelectric body laminated on one another in a thicknesses direction. This configuration reduces the thicknesses of driver parts 151 and 152.

Driver parts 151 and 152 are not limited to the parts that vibrate due to strains on piezoelectric elements 185 and 186; but may be of another type. For example, each driver part may be equipped with a member, device, or the like capable of generating a force due to interaction between a magnetic field and an electric field, thereby causing the driver part to vibrate. This force is generated as follows. At least one of a magnetic field and electric field produced by an external device is caused to change, or at least one of a magnetic field and electric field produced by the member, device, or the like is caused to change, thereby generating the force. Examples of the material of the piezoelectric body include a piezoelectric material, such as lead zirconate titanate (PZT), having a high piezoelectric constant. Piezoelectric elements 185 and 186 may extend to vibrating bodies 141 and 142, respectively, accordingly increasing torque for the transmission bodies.

Base 161 is used to attach reflective optical element 100 to an external structural member. Base 161 is connected with connection part 122 that couples vibrator parts 141 and 142 with base 161 vibratably with respect to base 161.

Connection part 122 is disposed along rotation axis 101. Base end 122B of connection part 122 is connected with base 161 while head end 122A thereof is connected with both base end 141B of vibrator part 141 and base end 142B of vibrator part 142.

The shape of connection part 122 is not particularly limited; however, connection part 123 has a rod shape preferably with a width equal to or larger than that of connection part 121 since connection part 122 is intended to twist to effectively transmitting the vibration of vibrator parts 141 and 142 as torque to connection part 121 via transmission parts 131 and 132. Connection part 122 has a rectangular cross-section perpendicular to rotation axis 101. Connection part 122 has the same thickness as connection part 121 and other portions. Thus, the width (the length in the X-axis direction in the figure) of connection part 122 is larger than that of connection part 121. Connection part 122 has the same cross-sectional shape over a region from base 161 to vibrator parts 141 and 142, that is, from base end 122B to head end 122A. Similarly to connection part 121, this configuration prevents concentration of stresses, thereby preventing connection part 122 from being broken due to the concentration. Moreover, the torsional rigidity of connection part 121 is smaller than that of connection part 122 under the condition that connection parts 121 and 122 have the same length in the direction of rotation axis 101.

Similarly to connection part 121, connection part 122 is not necessarily straight along rotation axis 101; but may be curved meanderingly or bent in a zigzag.

Monitor elements 171 and 172 are attached to transmission parts 131 and 132 so as to detect strains which exhibit the state of warping of transmission parts 131 and 132, respectively. In particular, in order to transmit torque to connection part 121, transmission parts 131 and 132 having rod shapes extending straight warp in the thickness direction (Z-axis direction) almost without twisting. This configuration allows monitor elements 171 and 172 to detect the warping of transmission parts 131 and 132 accurately. Therefore, monitor elements 171 and 172 correctly monitor the state of rotational vibration of reflector 110.

In accordance with the embodiment, monitor elements 171 and 172 are attached to transmission parts 131 and 132, respectively. Monitor elements 171 and 172 are connected with detection circuit 901. Detection circuit 901 differentially detects output signals. That is, Detection circuit 901 detects a difference between output signals from monitor elements 171 and 172, and then outputs a differential signal that corresponds to the difference. This operation allows various noises contained in the output signals from two monitor elements 171 and 172 to be canceled, thereby allows the difference to be used to monitor the state of rotational vibration of reflector 110 accurately. This configuration makes the monitoring result worth being fed back to control driver parts 151 and 152. Specifically, in accordance with the differential signal, detection circuit 901 controls the voltages applied to piezoelectric elements 185 and 186 so as to control the amplitudes of vibrations of driver parts 151 and 152.

In accordance with the embodiment, each of monitor elements 171 and 172 for detecting the strains on transmission parts 131 and 132 caused due to their warpage includes a pair of electrodes and a piezoelectric material sandwiched between the electrodes. Piezoelectric material of monitor elements 171 and 172 are preferably the same as piezoelectric elements 185 and 186. This configuration allows both monitor elements 171 and 172 and piezoelectric elements 185 and 186 to be formed a single process simultaneously and efficiently in manufacturing reflective optical element 100.

Instead of the piezoelectric material, monitor elements 171 and 172 may be implemented by strain-resistance elements, such as a metal strain gauge and semiconductor strain gauge, which have resistance values that change in response to strains.

In reflective optical element 100 according to the first embodiment, driver parts 151 and 152 are driven in opposite phases in directions opposite to each other, thereby causing vibrator parts 141 and 142 to vibrate in phases opposite to each other, thereby generating torque in the same rotation direction about rotation axis 101. Transmission parts 131 and 132 disposed on respective sides of rotation axis 101 transmit the torque to base end 121B of connection part 121 without cancelling out the torque between transmission parts 131 and 132, consequently transmitting the torque efficiently. This configuration increases the deflection angle of reflector 110 which rotationally vibrates in a resonance state even when driver parts 151 and 152 are driven at high frequencies. This configuration increases the deflection angle of reflector 110 also even when the voltages applied to piezoelectric elements 185 and 186 is low. That is, this configuration provides reflective optical element 100 with preferable deflection angle characteristics.

The present disclosure is not limited to the exemplary embodiments described above. For example, another exemplary embodiment according to the present disclosure may be implemented by optionally combining the constituent elements described herein and/or excluding some of the constituent elements. Moreover, the present disclosure also includes modifications obtained by making various changes, which would be conceived by those skilled in the art, to the above exemplary embodiments without departing from the scope and spirit of the present disclosure, that is, the meaning of the recitations in the claims.

Figure 3:
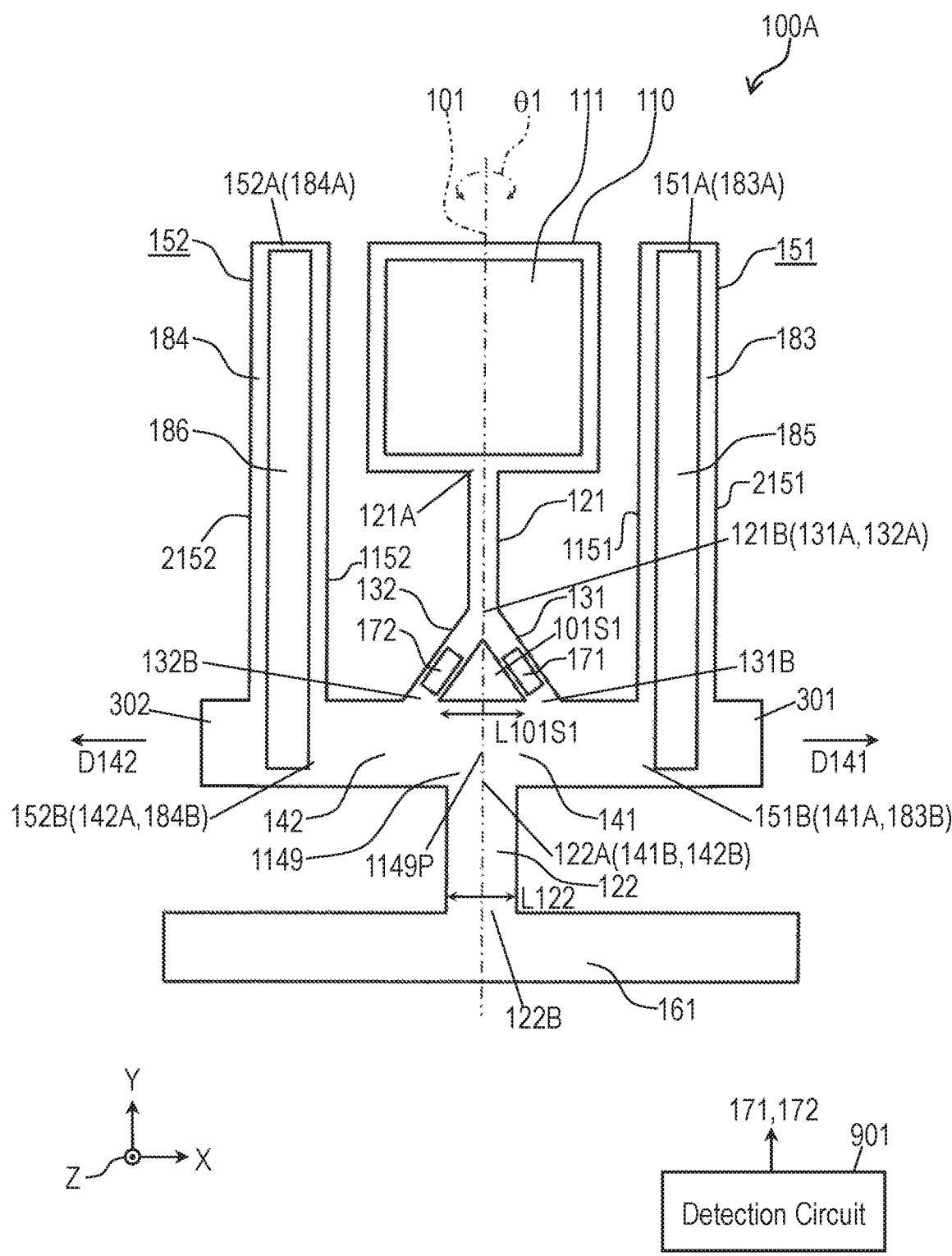
FIG. 3 is a plan view of another reflective optical element according to Embodiment 1.

FIG. 3 is a plan view of another reflective optical element 100A according to Embodiment 1. In FIG. 3, components identical to those of reflective optical element 100 shown in FIG. 1 are denoted by the same reference numerals. Reflective optical element 100A further includes projection part 301 protruding from driver part 151 and projection part 302 protruding from driver part 152. Projection part 301 is formed unitarily with driver body 183 such that the projection part protrudes in intersecting direction D141, i.e. the X-axis direction from a portion of head end 141A of vibrator part 141 opposite to driver part 151. Projection part 301 extends from vibrator part 141 in intersecting direction D141, i.e. the X-axis direction. Projection part 302 is formed unitarily with driver body 184 such that projection part 302 protrudes from a portion of head end 142A of vibrator part 142 in intersecting direction D142, i.e. the X-axis direction, opposite to driver part 152. Projection part 302 extends from vibrator part 142 in intersecting direction D142, i.e. the X-axis direction. Driver part 151 has outer edge 1151 which extends in the Y-axis direction and outer edge 2151 which extends in the Y-axis direction and which is located farther away from rotation axis 101 than outer edge 1151. Driver part 152 has outer edge 1152 which extends in the Y-axis direction and outer edge 2152 which extends in the Y-axis direction and which is located farther away from rotation axis 101 than outer edge 1152. The widths of projection parts 301 and 302 in the Y-axis direction are equal to those of vibrator parts 141 and 142 (head ends 141A and 142A). Projection parts 301 and 302 can be completely overlaps vibrator parts 141 and 142 (head ends 141A and 142A), respectively, when viewed in the X-axis direction.

In reflective optical element 100 shown in FIG. 1, outer edges 1151 and 1152 connected with vibrator parts 141 and 142 has higher rigidity than outer edges 2151 and 2152 that are free edges connected with nothing. When driver parts 151 and 152 vibrate in the Z-axis direction, particularly in the circumferential directions about rotation axis 101, outer edges 2151 and 2152 of vibrator parts 141 and 142 vibrate with a larger displacement than outer edges 1151 and 1152 having higher rigidity. If the amplitudes of vibrations of driver parts 151 and 152 become extremely large, the displacements of outer edges 2151 and 2152 become much larger than those of outer edges 1151 and 1152, and may cause a problem preventing stable driving due to, for example, fluctuations of the resonance frequency.

In contrast, in reflective optical element 100A shown in FIG. 3, projection parts 301 and 302 increase the rigidity of outer edges 2151 and 2152 of driver parts 151 and 152, and accordingly reduce differences in rigidity among outer edges 1151, 2151, 1152, and 2152. Projection parts 301 and 302 extend in the X-axis direction from portions of head ends 141A and 142A of vibrator parts 141 and 142 opposite to driver parts 151 and 152, respectively, and do not displace the respective centers of vibrations of driver parts 151 and 152. This configuration prevents the above problem even if the amplitudes of vibrations of driver parts 151 and 152 become extremely large.

Exemplary Embodiment 2

Next, another exemplary embodiment of the reflective optical element will be described. Note that the elements (parts) having the same function or effect and/or having the same shape, mechanism, or structure as those described in the first embodiment, are designated by the same numerals or symbols, and their explanations may be omitted. Moreover, the following description will focus on differences from the first embodiment, so that duplicate descriptions of subjects without differences may be omitted.

Figure 4:
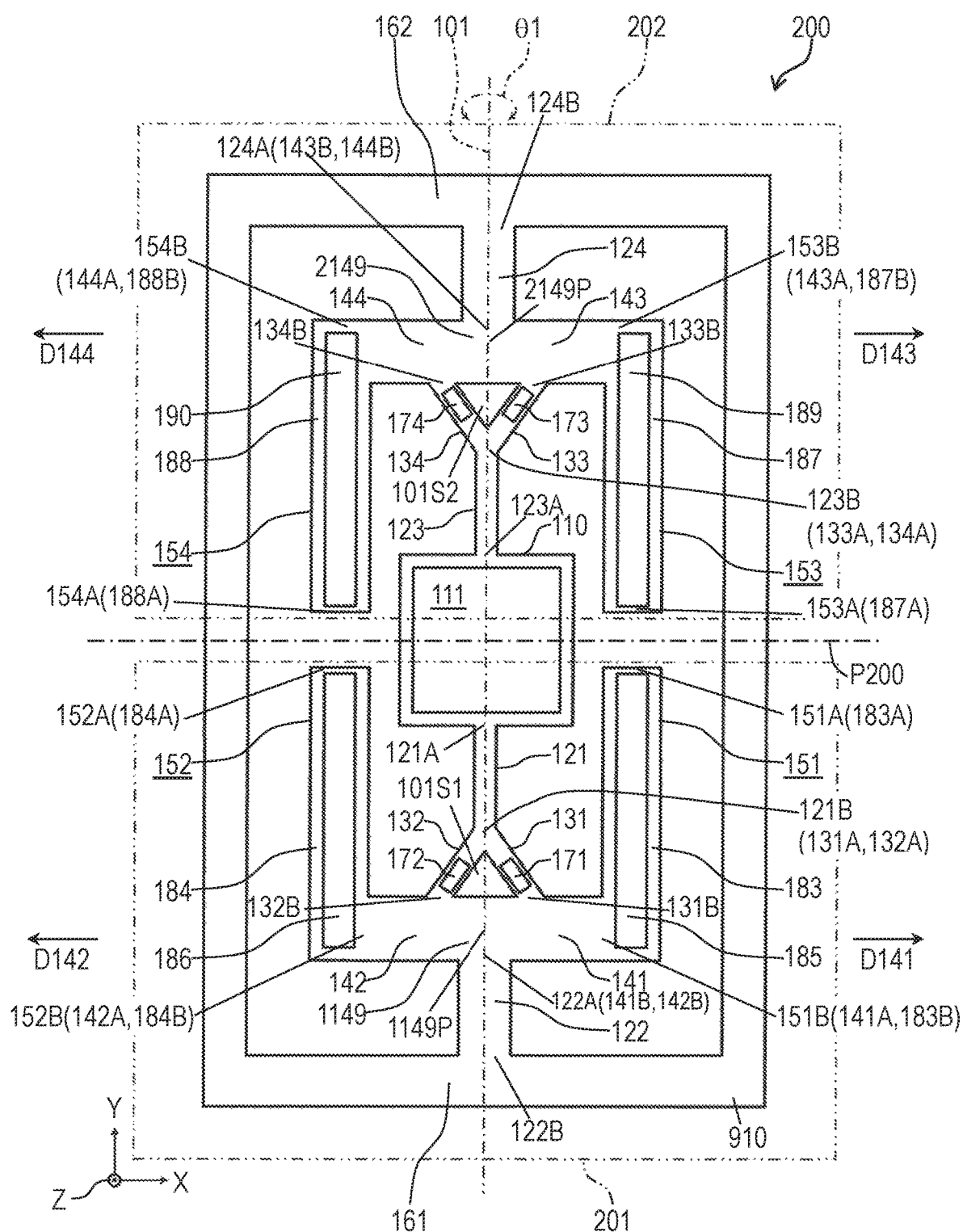
FIG. 4 is a plan view of a reflective optical element according to Exemplary Embodiment 2.

FIG. 4 is a plan view of reflective optical element 200 according to Exemplary Embodiment 2. In FIG. 4, components identical to those of reflective optical element 100 shown in FIGS. 1 and 2 according to Embodiment 1 are denoted by the same numerals.

In reflective optical element 200 according to Embodiment 2, single reflector 110 is rotationally vibrated by two rotational vibration mechanisms plane-symmetrical to each other with respect to virtual plane P200 which is perpendicular to rotation axis 101 and which includes the center of reflector 110. One of the two rotational vibration mechanisms includes connection parts, transmission parts, vibrator parts, driver parts, a base, and monitor elements while the other of the two includes respectively corresponding ones. The parts, base, and elements included in the one rotational vibration mechanism of the one rotational vibration mechanism are disposed plane-symmetrically to the corresponding parts, base, and elements of in the other rotational vibration mechanism with respect to virtual plane P200. These connection parts, transmission parts, vibrator parts, driver parts, base, monitor elements, and their functions and coupling modes of the rotational vibration mechanisms are the same as those of the element according to Embodiment 1.

In detail, as shown in FIG. 4, connection parts 123 and 124 of rotational vibration mechanism 202 are plane-symmetrical to connection parts 121 and 122 of rotational vibration mechanism 201, respectively. Connection part 123 is disposed along rotation axis 101 and on the opposite side of connection part 121 with respect to reflector 110. Head end 123A of connection part 123 is connected with reflector 110. Transmission parts 133 and 134 of rotational vibration mechanism 202 are plane-symmetrical to transmission parts 131 and 132 of rotational vibration mechanism 201, respectively. Vibrator parts 143 and 144 of rotational vibration mechanism 202 are plane-symmetrical y to vibrator parts 141 and 142 of rotational vibration mechanism 201, respectively. Driver parts 153 and 154 of rotational vibration mechanism 202 are plane-symmetrical to driver parts 151 and 152 of rotational vibration mechanism 201, respectively. In rotational vibration mechanism 201, driver part 153 includes driver body 187 and piezoelectric element 189, and driver part 154 includes driver body 188 and piezoelectric element 190. Base 162 of rotational vibration mechanism 202 is plane-symmetrical to base 161 of rotational vibration mechanism 201. In accordance with the embodiment, bases 161 162 are connected unitarily with each other to constitute frame 910 having a rectangular loop shape as a whole. However, bases 161 and 162 are not necessarily connected with each other to constitute frame 910. Similarly to rotational vibration mechanism 201, in rotational vibration mechanism 202, monitor element 173 is attached to transmission part 133 while monitor element 174 is attached to transmission part 134. Monitor elements 173 and 174 are made of the same material as monitor elements 171 and 172.

Rotational vibration mechanism 202 will be detailed below.

Connection parts 123 and 124 has head ends 123A and 124A and base ends 123B and 124B, and extend from head ends 123A to 124A to base ends 123B and 124B, namely from base ends 123B and 124B to head ends 123A to 124A, respectively. Transmission parts 133 and 134 has head ends 133A and 134A and base ends 133B and 134B, and extend from head ends 133A and 134A to base ends 133B and 134B, namely from base ends 133B and 134B to head ends 133A and 134A, respectively. Vibrator parts 143 and 144 has head ends 143A and 144A and base ends 143B and 144B, and extend from head ends 143A and 144A to base ends 143B and 144B, namely from base ends 143B and 144B to head ends 143A and 144A, respectively. Driver parts 153 and 154 has head ends 153A and 154A and base ends 153B and 154B, and extend from head ends 153A and 154A to base ends 153B and 154B, namely from base ends 153B and 154B to head ends 153A and 154A, respectively.

Connection part 123 is disposed along rotation axis 101. Head end 123A of the connection part is connected with reflector 110 to hold reflector 110. Connection part 123 transmits, to reflector 110, torque for rotationally swinging reflector 110. Connection part 123 twisted by angle θ1 about rotation axis 101 causes reflector 110 to rotationally swing by angle θ1 while holding reflector 110.

The shape of connection part 123 is not particularly limited; however, connection part 123 preferably has a thin rod shape with a narrower width (length in the X-axis direction in the figure) than reflector 110 since the connection part is intended to twist to cause reflector 110 to rotationally swing. Connection part 123 has a rectangular cross-section perpendicular to rotation axis 101. Connection part 123 has same thickness as reflector 110 and other portions. Connection part 123 has the same cross-sectional shape over a region from reflector 110 to transmission parts 133 and 134, that is, from head end 123A to base end 123B. Connection part 123 has a uniform shape and a uniform cross-sectional area along rotation axis 101. This configuration allows connection part 123 to twist uniformly as a whole when driving reflective optical element 200, thereby preventing connection part 123 from being broken due to concentration of stresses.

Transmission parts 133 and 134 transmit, to connection part 123, vibrations of vibrator parts 143 and 144 as torque. Head end 133A of transmission part 133 is connected with base end 123B of connection part 123 opposite to reflector 110 while base end 133B of transmission part 133 is connected with vibrator part 143. Transmission part 133 intersects rotation axis 101, extends from head end 133A away from rotation axis 101, and intersect vibrator part 143. Transmission part 134 is located on the opposite side of transmission part 133 with respect to the virtual plane which includes rotation axis 101 and which is perpendicular to the surface of reflector 110. Head end 134A of transmission part 134 is connected with base end 123B of connection part 123 opposite to reflector 110 while base end 134B is connected with vibrator part 144. Transmission part 134 intersects rotation axis 101, extends from head end 134A away from rotation axis 101, and intersect vibrator part 144.

In accordance with the embodiment, transmission part 133 and transmission part 134 are in rotational symmetry to each other. That is, one of the transmission parts m rotated by 180 degrees about rotation axis 101 becomes identical to the other; therefore, the transmission parts are disposed in line symmetry. Transmission part 133 has a straight rod shape which extends from base end 123B of connection part 123 to vibrator part 143, that is, from head end 133A to base end 133B of transmission part 133. Transmission part 134 has a straight rod shape which extends from base end 123B of connection part 123 to vibrator part 144, that is, from head end 134A to base end 134B of transmission part 134. Opening 101S2 (space) containing rotation axis 101 therein is provided between transmission part 133 and transmission part 134. Opening 101S2 is located on rotation axis 101. Transmission parts 133 and 134 having the rod shapes extending on a straight line transmit, to connection part 123, vibrations of vibrator parts 143 and 144 as torque efficiently. Moreover, the angle of the direction in which each of transmission parts 133 and 134 extends with respect to rotation axis 101 may be not smaller than 15 degrees to not larger than 80 degrees. The shapes of each of transmission parts 133 and 134 may be not the straight line, but also curved or bent shapes.

Vibrator parts 143 and 144 have arm shapes and vibrate in circumferential directions about rotation axis 101, thereby generating torque for rotationally swinging reflector 110. Vibrator parts 143 and 144 extend in intersecting directions D143 and D144 that intersect rotation axis 101, respectively. Vibrator part 143 is disposed on the side of transmission part 133 with respect to rotation axis 101 in intersecting direction D143 that intersects rotation axis 101. Vibrator part 143 is connected with base end 133B of transmission part 133. Vibrator part 144 is disposed on the opposite side transmission parts 133 with respect to rotation axis 101 in intersecting direction D144 that intersects rotation axis 101. Vibrator part 144 is connected with base end 134B of transmission part 134.

In accordance with the embodiment, vibrator part 143 has a rectangular rod shape that extends in a direction perpendicular to rotation axis 101. Vibrator part 144 has a rectangular rod shape that extends in a direction which is opposite to vibrator part 143 and which perpendicularly intersects rotation axis 101.

Base end 143B of vibrator part 143 is connected unitarily with base end 144B of vibrator part 144 at connection position 2149P on connection portion 2149. Vibrator part 143 and vibrator part 144 constitute a single straight rod that extends from rotation axis 101 as a center perpendicularly rotation axis 101. Base end 133B of transmission part 133 is connected with vibrator part 143 at a position between connection portion 2149 and driver part 153, that is, at a position between head end 143A and base end 143B of the vibrator part. Base end 134B of transmission part 134 is connected with vibrator part 144 at a position between connection portion 2149 and driver part 154, that is, at a position between head end 144A and base end 144B of the vibrator part. Moreover, both at least a part where transmission part 133 is connected with vibrator part 143 and at least a part where transmission part 134 is connected with vibrator part 144 are preferably disposed on outer side than connection part 124, that is, they are preferably farther away from rotation axis 101 than the contour of connection part 124. This configuration allows vibrations of vibrator parts 143 and 144 to be effectively transmitted to transmission parts 133 and 134. In accordance with the embodiment, the entire of the parts where transmission parts 133 and 134 are connected with vibrator parts 143 and 144 are disposed on the outer side than connection part 124, that is, are farther away from rotation axis 101 than the contour of connection part 124. That is, the width of opening 101S2 in a direction perpendicular to rotation axis 101 is equal to the gap between base end 133B of transmission part 133 and base end 134B of transmission part 134, and is larger than the width of connection part 124 in the direction perpendicular to rotation axis 101. The width of opening 101S2 in the direction perpendicular to rotation axis 101 includes the width of connection part 124 in the direction perpendicular to rotation axis 101.

Driver parts 153 and 154 generate driving forces that cause head ends 143A and 144A of vibrator parts 143 and 144 to vibrate, respectively, in circumferential directions about rotation axis 101. Driver part 153 is connected with head end 143A of vibrator part 143, and causes vibrator part 143 to vibrate in circumferential directions about rotation axis 101, which in turn causes, via transmission part 133, connection part 123 to rotationally swing about rotation axis

101. Driver part 154 is connected with head end 144A of vibrator part 144, and causes vibrator part 144 to vibrate in circumferential directions about rotation axis 101, which in turn causes, via transmission part 134, connection part 123 to swing rotationally about rotation axis 101.

In accordance with the embodiment, base end 153B of driver part 153 is connected unitarily with head end 143A of vibrator part 143, and driver part 153 includes driver body 187 extending along rotation axis 101 toward reflector 110. Driver body 187 has a rod shape with a rectangular cross-section. Driver body 187 includes head end 187A and base end 187B, and extends from head end 187A to base end 187B, namely from base end 187B to head end 187A. Head end 153A and base end 153B of driver part 153 are identical to head end 187A and base end 187B of driver body 187, respectively. Piezoelectric element 189 having a slender plate shape is disposed on the surface of driver body 187 along rotation axis 101. A voltage which periodically changes and is applied to piezoelectric element 189 causes piezoelectric element 189 to repetitively expand and contract alternately. In response to the expansion and contraction of piezoelectric element 189, driver body 187 (driver part 153) warps and recovers repetitively. In driver body 187 (driver part 153), head end 187A protruding more largely than base end 187B connected with vibrator part 143 vibrates more greatly than base end 187B. Then, vibration energy of the entire of driver body 187 (driver part 153) is transmitted to head end 143A of vibrator part 143.

Similarly to driver part 153, driver part 154 includes driver body 188 and piezoelectric element 190, and is disposed at a position symmetrical to driver part 153 with respect to the virtual plane which includes rotation axis 101 and which perpendicularly intersects the surface of reflector 110. Driver part 154 operates similarly to driver part 153.

That is, base end 154B of driver part 154 is connected unitarily with head end 144A of vibrator part 144, and driver part 154 includes driver body 188 extending along rotation axis 101 toward reflector 110. Driver body 188 has a rod shape with a rectangular cross-section. Driver body 188 includes head end 188A and base end 188B, and extends from head end 188A to base end 188B, namely from base end 188B to head end 188A. Head end 154A and base end 154B of driver part 154 are identical to head end 188A and base end 188B of driver body 188, respectively. Piezoelectric element 190 having a slender plate shape is disposed on the surface of driver body 188 along rotation axis 101. A voltage which periodically changes and which is applied to piezoelectric element 190 causes piezoelectric element 190 to repetitively expand and contract alternately. In response to the expansion and contraction of piezoelectric element 190, driver body 188 (driver part 154) warps and recovers repetitively. In driver body 188 (driver part 154), head end 188A protruding more largely than base end 188B connected with vibrator part 144, vibrates more greatly than base end 188B. Then, vibration energy of the entire of driver body 188 (driver part 154) is transmitted to head end 144A of vibrator part 144.

In accordance with the embodiment, each of piezoelectric elements 189 and 190 is a thin-film laminated piezoelectric actuator which is formed on the surface of corresponding one of drive bodies 187 and 188. The actuator has a laminated body structure in which electrodes and a piezoelectric body are laminated on one another in a thicknesses direction. This structure further reduces the thicknesses of driver parts 153 and 154.

Driver parts 153 and 154 are not limited to the parts that vibrate due to strains on piezoelectric elements 189 and 190; they may be of another type. For example, each driver part may be equipped with a member, device, or the like device capable of generating a force via interaction between a magnetic field and an electric field, thereby causing the driver parts to vibrate. Such a force is generated in a way as follows: At least one of a magnetic field and electric field produced by an external device is caused to vary, or at least one of a magnetic field and electric field produced by the member, device, or the like device is caused to vary, which thereby generates the force. Moreover, examples of the material configuring the piezoelectric body include a piezoelectric material, such as lead zirconate titanate (PZT), which features a high piezoelectric constant.

Base 162 is used to attach reflective optical element 200 to an external structural member. Base 162 is connected with connection part 124 that is used to couple vibrator parts 143 and 144 with base 162 vibratably with respect to base 162.

Connection part 124 is disposed along rotation axis 101. Base end 124B of connection part 124 is connected with base 162 while head end 124A thereof is connected with both base end 143B of vibrator part 143 and base end 144B of vibrator part 144.

The shape of connection part 124 is not particularly limited; however, connection part 124 has a rod shape with a width preferably equal to or larger than that of connection part 123 since connection part 124 is intended to twist so as to effectively transmitting the vibration of vibrator parts 143 and 144 as torque to connection part 123 via transmission parts 133 and 134. Connection part 124 has a rectangular cross-section perpendicular to rotation axis 101. Connection part 124 has the same thickness as connection part 123 and other portions. Thus, the width (the length in the X-axis direction in the figure) of connection part 124 is larger than that of connection part 123. Connection part 124 has the same cross-sectional shape over a region from base 162 to vibrator parts 143 and 144, that is, from base end 124B to head end 124A. Similarly to connection part 123, this configuration avoids concentration of stresses, thereby preventing connection part 124 from being broken due to the concentration. Moreover, the torsional rigidity of connection part 123 is smaller than that of connection part 124 under the condition that connection parts 123 and 124 have the same length in the direction of rotation axis 101.

Similarly to connection part 123, connection part 124 is not necessarily straight along rotation axis 101; but may be curved meanderingly or bent in a zigzag.

Monitor elements 173 and 174 are attached to transmission parts 133 and 134 so as to detect, as strains, the states of being-curved of transmission parts 133 and 134, respectively. In particular, in order to transmit torque to connection part 123, transmission parts 133 and 134 having rod shapes extending straight warp in the thickness direction (Z-axis direction) almost without twisting. This configuration allows monitor elements 173 and 174 to detect the warpage of transmission parts 133 and 134 accurately. Therefore, monitor elements 173 and 174 monitor the state of rotational swinging of reflector 110.

In accordance with the embodiment, monitor elements 173 and 174 are attached to transmission parts 133 and 134, respectively. Monitor elements 173 and 174 are connected with detection circuit 901 (see FIG. 1). Detection circuit 901 differentially detects output signals from two monitor elements 173 and 174, similarly to the output signals from monitor elements 171 and 172. That is, the detection circuit detects a difference between the output signals from two monitor elements 173 and 174. Specifically, detection circuit 901 generates a differential signal based on both a signal that is obtained through the differential detection of the output signals from two monitor elements 173 and 174 and a signal that is obtained through the differential detection of the output signals from two monitor elements 171 and 172. This operation causes various noises in the output signals to cancel each other out, thereby monitoring the state of rotational swinging of reflector 110 accurately. This configuration provides the monitoring result worth being fed back to control driver parts 153 and 154. Specifically, in accordance with the differential signal, detection circuit 901 controls the voltage applied to piezoelectric elements 189 and 190, thereby controlling the amplitudes of vibrations of driver parts 153 and 154.

In reflective optical element 200 according to Embodiment 2, driver parts 153 and 154 are driven in opposite phases in directions opposite to each other, thereby causing vibrator parts 143 and 144 to vibrate in opposite phases, thereby generating torque in the same rotational direction about rotation axis 101. Transmission parts 133 and 134 disposed away from each other on respective sides of rotation axis 101 transmit the torque to base end 123B of connection part 123 efficiently without cancelling out the torque between transmission parts 133 and 134. This operation increases the deflection angle of reflector 11 which rotationally swings in a resonance state even when driver parts 151 to 154 are driven at high frequencies. This operation also increases the deflection angle of reflector 110 even when the voltage applied to piezoelectric elements 185, 186, 189, and 190 is low. That is, this configuration provides reflective optical element 200 with preferable deflection angle characteristics.

Connection parts 123 and 124, driver parts 153 and 154, and vibrator parts 143 and 144 face connection parts 121 and 122, driver parts 151 and 152, and vibrator parts 141 and 142, respectively, across a line (virtual plane P200) perpendicularly intersecting rotation axis 101.

In reflective optical element 200 according to Embodiment 2, driver part 151 and driver part 153 are driven in phase while driver part 152 and driver part 154 are driven in phase. Driver parts 152 and 154 are driven in phase and direction opposite to those in which driver parts 151 and 153 are driven, so that driver part 151 and driver part 153 move in a direction opposite to driver part 152 and driver part 154. This configuration allows vibrator parts 141 and 143 to vibrate in an opposite phase to vibrator parts 142 and 144. Each of these vibrations in the opposite phases generates torque in the same rotation direction about rotation axis 101, thereby large torque in the same rotational direction about rotation axis 101.

In addition to the advantages of Embodiment 1, reflective optical element 200 according to Embodiment 2 has further advantages as follows: Since the torque for causing rotational vibration is transmitted to reflector 110 from both sides of the reflector along rotation axis 101, it is possible to increase the deflection angle of reflector 110. In cases where the deflection angle of the reflector is equal to that of Embodiment 1, the voltage to be applied to each of the piezoelectric elements may be reduced.

In addition, the ends of base 161 are connected with the corresponding ends of base 162, thereby constituting frame 910 having a frame shape. This configuration enhances the structural strength of the entire of reflective optical element 200, resulting in a stable rotational vibration of reflector 110. That is, this configuration provides reflector 110 with large resistant to undesired shakes, resulting in stable rotational vibration about rotation axis 101.

Reflective optical element 200 may further include projection parts protruding from respective driver parts 153 and 154, similarly to projection parts 301 and 302 of reflective optical element 100A shown in FIG. 3, providing the same effects.

Exemplary Embodiment 3

Next, another exemplary embodiment of the reflective optical element will be described. Note that the elements (parts) having the same function or effect and/or having the same shape, mechanism, or structure as those described in the first and second embodiments, are designated by the same numerals or symbols, and their explanations may be omitted. Moreover, the following description will focus on differences from the first and second embodiments, so that duplicate descriptions of subjects without differences may be omitted.

Figure 5:
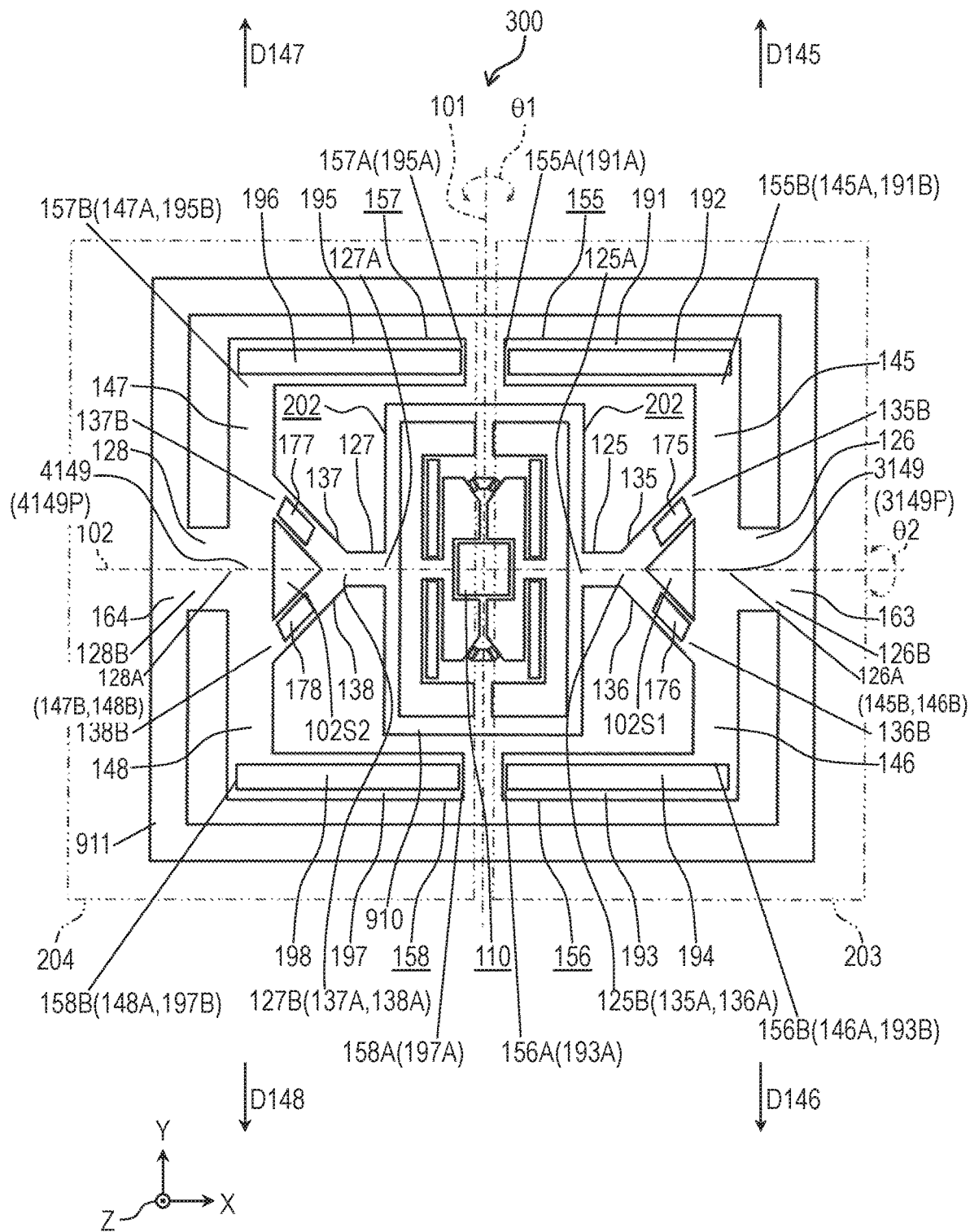
FIG. 5 is a plan view of a reflective optical element according to Exemplary Embodiment 3.

FIG. 5 is a plan view of reflective optical element 300 according to Exemplary Embodiment 3. In FIG. 5, components identical to those of reflective optical elements 100 and 200 shown in FIGS. 1, 2, and 4 according to Embodiments 1 and 2 are denoted by the same numerals. The reference numerals denoting detailed components of rotational vibration mechanisms 201 and 202 are omitted.

Reflective optical element 300 according to Embodiment 3 further includes rotational vibration mechanisms 203 and 204 configured to rotationally swinging reflector 110, rotational vibration mechanism 201, and rotational vibration mechanism 202 of reflective optical element 200 according to Embodiment 2 as a whole.

Rotational vibration mechanism 203 causes frame 910 to swing rotationally about rotation axis 102 that intersects rotation axis 101 (at a right angle in the embodiment) about which rotational vibration mechanisms 201 and 202 rotationally swing reflector 110. This causes reflector 110, rotational vibration mechanism 201, and rotational vibration mechanism 202 to swing rotationally about rotation axis 102 as a whole. Similarly to rotational vibration mechanisms 201 and 202, each of rotational vibration mechanisms 203 and 204 includes connection parts, transmission parts, vibrator parts, driver parts, base, and monitor elements. Moreover, the functions and coupling of the connection parts, transmission parts, vibrator parts, driver parts, base, and monitor elements, are the same as those of Embodiment 2.

Specifically, as shown in FIG. 5, rotational vibration mechanisms 203 includes connection parts 125 and 126, transmission parts 135 and 136, vibrator parts 145 and 146, driver parts 155 and 156, and base 163.

Connection parts 125 and 126 respectively has head ends 125A and 126A and base ends 125B and 126B, respectively, and extend from head ends 125A to 126A to base ends 125B and 126B, namely from base ends 125B and 126B to head ends 125A to 126A, respectively. Transmission parts 135 and 136 has head ends 135A and 136A and base ends 135B and 136B, respectively, and extend from head ends 135A and 136A to base ends 135B and 136B, namely from base ends 135B and 136B to head ends 135A and 136A, respectively. Vibrator parts 145 and 146 has head ends 145A and 146A and base ends 145B and 146B, respectively, and extend from head ends 145A and 146A to base ends 145B and 146B, namely from base ends 145B and 146B to head ends 145A and 146A, respectively. Driver parts 155 and 156 has head ends 155A and 156A and base ends 155B and 156B, respectively, and extend from head ends 155A and 156A to base ends 155B and 156B, namely from base ends 155B and 156B to head ends 155A and 156A, respectively.

Connection part 125 is disposed along rotation axis 102 that passes through reflector 110. Head end 125A of connection part 125 is connected with frame 910 constituted by bases 161 and 162. Driver part 155 includes driver body 191 and piezoelectric element 192 disposed on driver body 191. Driver part 156 includes driver body 193 and piezoelectric element 194 disposed on driver body 193. In accordance with the embodiment, base 163 is a member with which reflective optical element 300 is attached to an external structural member. Base 161 is attached unitarily to head end 125A of connection part 125 of rotational vibration mechanism 203. Similarly to rotational vibration mechanism 201 and the like, in rotational vibration mechanism 203, monitor element 175 is attached to transmission part 135 while monitor element 176 is attached to transmission part 136.

Rotational vibration mechanism 203 will be detailed below.

Connection part 125 is disposed along rotation axis 102. Head end 125A of connection part 125 is connected with frame 910 to hold frame 910. Connection part 125 transmits, to frame 910, torque for rotationally vibrating frame 910. Connection part 125 twisted by angle θ2 about rotation axis 102 causes frame 910 to rotationally swing by angle θ2 while holding frame 910.

The shape of connection part 125 is not particularly limited; however, connection part 125 has a thin rod shape with a width (a length in the Y-axis direction in the figure) smaller than that of frame 910 since connection part 125 is intended to twist, thereby causing frame 910 to rotationally swing. Connection part 125 has a rectangular cross-section perpendicular to rotation axis 102. Connection part 125 has the same thickness as frame 910 and other portions. Connection part 125 has the same cross-sectional shape over a region from frame 910 to transmission parts 135 and 136, that is, from head end 125A to base end 125B. Connection part 125 thus has a uniform shape and a uniform cross-sectional area along rotation axis 102. This configuration allows connection part 125 to twist uniformly as a whole when driving reflective optical element 300, thereby preventing connection part 125 from being broken due to concentration of stresses.

These constituent elements do not necessarily have to have the same thickness. For example, base 163 may be preferably thicker than other portions, thereby allocating spaces in the Z-axis direction which are necessary for driving driver parts 155 and 156 and frame 910 in cases where reflective optical element 300 is mounted on a flat surface, for example, of other product. Such a thicker base also preferably increases the structural strength of the whole of reflective optical element 300.

The phrase, "along rotation axis 102", herein means not only that connection part 125 has a straight shape along the axis according to the embodiment, but also that connection part 125 is curved meanderingly or bent in a zigzag, for example. Connection part 125 having above configuration is regarded as a whole substantially along a virtual straight line, i.e. rotation axis 102.

Transmission parts 135 and 136 transmit, to connection part 125, vibrations of vibrator parts 145 and 146 as torque. Head end 135A of transmission part 135 is connected with base end 125B of connection part 125 opposite to frame 910 while base end 135B thereof is connected with vibrator part 145. Transmission part 135 intersects rotation axis 102, extends from head end 135A away from rotation axis 102, and intersect vibrator part 145. Transmission part 136 is located on the opposite side of transmission part 135 with respect to a virtual plane which includes rotation axis 102 and which is perpendicular to rotation axis 101. Head end 136A of transmission part 136 is connected with base end 125B of connection part 125 opposite to frame 910, and base end 136B thereof is connected with vibrator part 146. Transmission part 136 intersects rotation axis 102, extends from head end 136A away from rotation axis 102, and intersect vibrator part 146.

In accordance with the embodiment, transmission part 135 and transmission part 136 are disposed in rotational symmetry to each other in which if one of them is rotated at 180 degrees about rotation axis 102 it becomes identical to the other; therefore, they are disposed in line symmetry. Transmission part 135 has a straight rod shape which extends from base end 125B of connection part 125 to vibrator part 145, that is, from head end 135A to base end 135B of transmission part 135. Transmission part 136 has a straight rod shape which extends from base end 125B of connection part 125 to vibrator part 146, that is, from head end 136A to base end 136B of transmission part 136. Opening 102S1 (space) containing rotation axis 102 is provided between transmission part 135 and transmission part 136. Opening 102S1 is located on rotation axis 102. In the case where transmission parts 135 and 136 have rod shapes extending on a straight line, transmission parts 135 and 136 efficiently transmit, to connection part 125, vibrations of vibrator parts 145 and 146 as torque. The angle of the direction in which each of transmission parts 135 and 136 extends with respect to rotation axis 102 may be not smaller than 15 degrees to not larger than 80 degrees. The shape of each of transmission parts 135 and 136 may be not only a straight line, but also a curved or bent shape.

Vibrator parts 145 and 146 have arm shapes which vibrate in circumferential directions about rotation axis 102, thereby generating torque for rotationally swinging frame 910. The vibrator parts extend in intersecting directions D145 and D146 that intersect rotation axis 102. Vibrator part 145 is disposed on the side of transmission part 135 with respect to rotation axis 102 in intersecting direction D145 that intersects rotation axis 102. Vibrator part 145 is connected with base end 135B of transmission part 135. Vibrator part 146 is disposed on the opposite side of transmission parts 135 with respect to rotation axis 102 in intersecting direction D146 that intersects rotation axis 102. Vibrator part 146 is connected with base end 136B of transmission part 136.

In accordance with the embodiment, vibrator part 145 has a rectangular rod shape that extends in a direction perpendicular to rotation axis 102. Vibrator part 146 has a rectangular rod shape that extends in a direction which is opposite to vibrator part 145 and which perpendicularly intersects rotation axis 102.

Connection portion 3149 unitarily connects base end 145B of vibrator part 145 with base end 146B of vibrator part 146 at connection position 3149P on connection portion 3149. Vibrator part 145 and vibrator part 146 constitute a single straight rod that extends from rotation axis 102 as a center in directions perpendicular to rotation axis 102. Base end 135B of transmission part 135 is connected with vibrator part 145 at a position between connection portion 3149 and driver part 155, that is, at a position between head end 145A and base end 145B of the vibrator part. Base end 136B of transmission part 136 is connected with vibrator part 146 at a position between connection portion 3149 and driver part 156, that is, at a position between head end 146A and base end 146B of the vibrator part. Both at least a part where transmission part 135 is connected with vibrator part 145 and at least a part where transmission part 136 is connected with vibrator part 146 are preferably disposed on outer sides from connection part 126, that is, are preferably farther away from rotation axis 102 than the contour of connection part 126. This configuration allows vibrations of vibrator parts 145 and 146 to be effectively transmitted to transmission parts 135 and 136. In accordance with the embodiment, the entire of each of the parts where transmission parts 135 and 136 are respectively connected with vibrator parts 145 and 146 is disposed on outer sides from connection part 126, that is, the whole is farther away from rotation axis 102 than the contour of connection part 126. That is, the width of opening 102S1 in the direction perpendicular to rotation axis 102 is equal to the gap between base end 135B of transmission part 135 and base end 136B of transmission part 136, and is larger than the width of connection part 126 in the direction perpendicular to rotation axis 102. The width of opening 102S1 in the direction perpendicular to rotation axis 102 includes the width of connection part 126 in the direction perpendicular to rotation axis 102.

Driver parts 155 and 156 generate driving forces that cause head ends 145A and 146A of vibrator parts 145 and 146 to vibrate, respectively, in circumferential directions about the center, rotation axis 102. Driver part 155 is connected with head end 145A of vibrator part 145, and causes vibrator part 145 to vibrate in the circumferential directions about rotation axis 102, which in turn causes, via transmission part 135, connection part 125 to swing rotationally about rotation axis 102. Driver part 156 is connected with head end 146A of vibrator part 146, and causes vibrator part 146 to vibrate in the circumferential directions about rotation axis 102, which in turn causes, via transmission part 136, connection part 125 to swing rotationally about rotation axis 102.

In accordance with the embodiment, base end 155B of driver part 155 is connected unitarily with head end 145A of vibrator part 145, and driver part 155 includes driver body 191 extending along rotation axis 102 toward frame 910. Driver body 191 has a rod shape with a rectangular cross-section. Driver body 191 has head end 191A and base end 191B, and extends from head end 191A to base end 191B, namely from base end 191B to head end 191A. Head end 155A and base end 155B of driver part 155 are identical to head end 191A and base end 191B of driver body 191, respectively. Piezoelectric element 192 having a slender plate shape is disposed on the surface of driver body 191 along rotation axis 102. A voltage which periodically changes and which is applied to piezoelectric element 192 causes piezoelectric element 192 to repetitively expand and contract alternately. In response to the expansion and contraction of piezoelectric element 192, driver body 191 (driver part 155) warps and recovers repeatedly. In driver body 191 (driver part 155), head end 191A protruding more largely than base end 191B connected with vibrator part 145, vibrates more greatly than base end 191B. Then, vibration energy of the entire of driver body 191 (driver part 155) is transmitted to head end 145A of vibrator part 145.

Similarly to driver part 155, driver part 156 includes driver body 193 and piezoelectric element 194, and is disposed at a position symmetrical to driver part 155 with respect to the virtual plane which includes rotation axis 102 and which perpendicularly intersects rotation axis 101. Driver part 156 operates similarly to driver part 155.

That is, base end 156B of driver part 156 is connected unitarily with head end 146A of vibrator part 146, and driver part 156 includes driver body 193 extending along rotation axis 102 toward frame 910. Driver body 193 has a rod shape with a rectangular cross-section. Driver body 193 has head end 193A and base end 193B, and extends from head end 193A to base end 193B, namely from base end 193B to head end 193A. Head end 156A and base end 156B of driver part 156 are identical to head end 193A and base end 193B of driver body 193, respectively. Piezoelectric element 194 having a slender plate shape is disposed on the surface of driver body 193 along rotation axis 102. A voltage which periodically changes and which is applied to piezoelectric element 194 causes piezoelectric element 194 to repetitively expand and contract alternately. In response to the expansion and contraction of piezoelectric element 194, driver body 193 (driver part 156) warps and recovers repeatedly. In driver body 193 (driver part 156), head end 193A protruding more largely than base end 193B connected with vibrator part 146, vibrates more greatly than base end 193B. Then, vibration energy of the entire of driver body 193 (driver part 156) is transmitted to head end 146A of vibrator part 146.

In accordance with the embodiment, each of piezoelectric elements 192 and 194 is a thin-film laminated piezoelectric actuator which is formed on the surface of corresponding one of drive bodies 191 and 193. The actuator has a laminated body structure in which electrodes and a piezoelectric body are laminated on one another in the thickness direction. This structure further reduces the thicknesses of driver parts 155 and 156.

Driver parts 155 and 156 are not limited to the parts that vibrate due to strains on piezoelectric elements 192 and 194; they may be of another type. For example, each of the driver parts may be equipped with a member, device, or the like capable of generating a force via interaction between a magnetic field and an electric field, thereby causing the driver parts to vibrate. Such a force is generated in a way as follows: At least one of a magnetic field and electric field produced by an external device is caused to vary, or at least one of a magnetic field and electric field produced by the member, device, or the like changes, which thereby generates the force. Moreover, examples of the material configuring the piezoelectric body include a piezoelectric material, such as lead zirconate titanate (PZT), which features a high piezoelectric constant.

Base 163 is used to attach reflective optical element 300 to an external structural member and the like. Base 163 is connected with connection part 126 that is used to couple vibrator parts 145 and 146 with base 163 vibratably with respect to base 163.

Connection part 126 is disposed along rotation axis 102. Base end 126B of connection part 126 is connected with base 163 while head end 126A thereof is connected with both base end 145B of vibrator part 145 and base end 146B of vibrator part 146.

The shape of connection part 126 is not particularly limited; however, connection part 126 has a rod shape having a width equal to or larger than connection part 125 since connection part 126 is intended to twist, thereby effectively transmitting the vibration, as torque, of vibrator parts 145 and 146 to connection part 125 via transmission parts 135 and 136. Connection part 126 has a rectangular cross-section perpendicular to rotation axis 102. Connection part 126 has the same thickness as connection part 125 and other portions. Thus, the width (the length in the Y-axis direction in the figure) of connection part 126 is larger than that of connection part 125. Connection part 126 has the same cross-section over a region from base 163 to vibrator parts 145 and 146, that is, from base end 126B to head end 126A. Similarly to connection part 125, this configuration prevents concentration of stresses, thereby preventing connection part 126 from being broken due to the concentration. The torsional rigidity of connection part 125 is smaller than that of connection part 126 under the condition that both have the same length in the direction of rotation axis 102.

Similarly to connection part 125, connection part 126 is not necessarily straight along rotation axis 102; it may be curved meanderingly or bent in a zigzag.

Monitor elements 175 and 176 are attached to transmission parts 135 and 136 so as to detect strains on transmission parts 135 and 136 as the states of warpage of transmission parts 135 and 136, respectively. In particular, in order to transmit torque to connection part 125, transmission parts 135 and 136 having a rod shape extending straight warp in the thickness direction (Z-axis direction) almost without twisting. This configuration allows monitor elements 175 and 176 to detect the warpage of transmission parts 135 and 136 accurately. Therefore, monitor elements 175 and 176 correctly monitor the state of rotational vibration of frame 910.

In accordance with the embodiment, monitor elements 175 and 176 are attached to transmission parts 135 and 136, respectively. Monitor elements 175 and 176 are connected with detection circuit 901. Detection circuit 901 differentially detects output signals from two monitor elements 175 and 176, similarly to the output signals from monitor elements 171 and 172. That is, the detection circuit detects a difference between the output signals from two monitor elements 175 and 176, and outputs a differential signal in accordance with the difference. This operation causes various noises in the output signals to cancel each other, thereby monitoring the state of rotational vibration of frame 910 accurately. This configuration makes the monitoring result worth being fed back to control driver parts 155 and 156. Specifically, in accordance with the differential signal, detection circuit 901 controls the voltages applied to piezoelectric elements 192 and 194, thereby controlling the amplitudes of vibrations of driver parts 155 and 156.

In reflective optical element 300 according to Embodiment 3, driver parts 155 and 156 are driven in opposite phases and in directions opposite to each other, thereby causing vibrator parts 145 and 146 to vibrate in opposite phases, and generating torque in the same rotation direction about rotation axis 102. Transmission parts 135 and 136 disposed apart on respective sides of rotation axis 102 transmit the torque to base end 125B of connection part 125 without cancelling out the torque between transmission parts 135 and 136, hence efficiently transmitting the torque. This configuration increases the deflection angle of frame 910 which rotationally swings even when driver parts 155 and 156 are driven at high frequencies. This configuration increases the deflection angle of reflector 110 also even when the voltage applied to piezoelectric elements 192 and 194 is low. That is, this configuration provides reflective optical element 300 with preferable deflection angle characteristics.

Rotational vibration mechanism 204 is located in plane symmetry to rotational vibration mechanism 203 with respect to the virtual plane which is perpendicular to rotation axis 102 and which includes the center of reflector 110. The connection parts, the transmission parts, the vibrator parts, the driver parts, the base, and the monitor elements of rotational vibration mechanism 204, are disposed in plane symmetry to the connection parts, the transmission parts, the vibrator parts, the driver parts, the base, and the monitor elements of rotational vibration mechanism 203, respectively.

Specifically, connection parts 127 and 128 of rotational vibration mechanism 204 are in plane symmetry to connection parts 125 and 126 included of rotational vibration mechanism 203, respectively. Connection part 127 is disposed along rotation axis 102 on the opposite side of connection part 125 with respect to reflector 110. Head end 127A of connection part 127 is connected with base 162. Transmission parts 137 and 138 of rotational vibration mechanism 204 are in plane symmetry with transmission parts 135 and 136 of rotational vibration mechanism 203, respectively. Vibrator parts 147 and 148 of rotational vibration mechanism 204 are in plane symmetry to vibrator parts 145 and 146 of rotational vibration mechanism 203, respectively. Driver parts 157 and 158 of rotational vibration mechanism 204 are in plane symmetry to driver parts 155 and 156 of rotational vibration mechanism 203, respectively. Driver part 157 includes driver body 195 and piezoelectric element 196 disposed on driver body 195. Driver part 158 includes driver body 197 and piezoelectric element 198 disposed on driver body 197. This configuration is the same as that of rotational vibration mechanism 203. Base 164 of rotational vibration mechanism 204 is in plane symmetry to base 163 of rotational vibration mechanism 203. In accordance with the embodiment, base 163 and base 164 are connected unitarily with each other to constitute frame 911 having a rectangular loop shape as a whole. In rotational vibration mechanism 204, monitor element 177 is attached to transmission part 137 while monitor element 178 is attached to transmission part 138 in plane symmetry to rotational vibration mechanism 203. Monitor elements 175 to 178 are made of the same material of monitor elements 171 to 174. Rotational vibration mechanism 204 will be detailed below.

Connection parts 127 and 128 have head ends 127A and 128A and base ends 127B and 128B, respectively, and extend from head ends 127A to 128A to base ends 127B and 128B, namely from base ends 127B and 128B to head ends 127A to 128A, respectively. Transmission parts 137 and 138 have head ends 137A and 138A and base ends 137B and 138B, respectively, and extend from head ends 137A and 138A to base ends 137B and 138B, namely from base ends 137B and 138B to head ends 137A and 138A, respectively. Vibrator parts 147 and 148 have head ends 147A and 148A and base ends 147B and 148B, respectively, and extend from head ends 147A and 148A to base ends 147B and 148B, namely from base ends 147B and 148B to head ends 147A and 148A, respectively. Driver parts 157 and 158 have head ends 157A and 158A and base ends 157B and 158B, respectively, and extend from head ends 157A and 158A to base ends 157B and 158B, namely from base ends 157B and 158B to head ends 157A and 158A, respectively.

Connection part 127 is disposed along rotation axis 102. Head end 127A of the connection part is connected with frame 910 to hold frame 910. Connection part 127 transmits, to frame 910, torque for rotationally vibrating frame 910. Connection part 127 twisting by angle $\theta2$ about rotation axis 102 causes frame 910 to rotationally swing by angle $\theta2$ while holding frame 910.

The shape of connection part 127 is not particularly limited; however, the connection part is a thin rod shape with a narrower width (length in the Y-axis direction in the figure) than that of frame 910 since connection part 127 is intended to twist so as to cause frame 910 to rotationally swing. Connection part 127 has a rectangular cross-section perpendicular to rotation axis 102. Connection part 127 has the same thickness as frame 910 and other portions. Connection part 127 has the same cross-section over a region from frame 910 to transmission parts 137 and 138, that is, from head end 127A to base end 127B. Connection part 127 thus has a uniform shape and a uniform cross-sectional area along rotation axis 102. This configuration allows connection part 127 to twist uniformly as a whole when driving reflective optical element 300, thereby preventing connection part 127 from being broken due to concentration of stresses.

These constituent elements do not necessarily have the same thickness. For example, base 164 may be preferably thicker than other portions, thereby allocating spaces in the Z-axis direction which are necessary for the driving of driver parts 157 and 158 and frame 910 in cases where reflective optical element 300 is mounted on a flat surface, for example, of other product. The thicker base also preferably increases the structural strength of the whole of reflective optical element 300.

The phrase, "along rotation axis 102" herein means not only that connection part 127 has a straight shape along the axis as described according to the embodiment, but also that connection part 127 is curved meanderingly or bent in a zigzag, for example, in which the connection part is regarded as a whole substantially along a virtual straight line, i.e. rotation axis 102.

Transmission parts 137 and 138 transmit, to connection part 127, vibrations of vibrator parts 147 and 148 as torque. Head end 137A of transmission part 137 is connected with base end 127B of connection part 127 opposite to frame 910 while base end 137B thereof is connected with vibrator part 147. Transmission part 137 intersects rotation axis 102, extends from head end 137A away from rotation axis 102, and intersect vibrator part 147. Transmission part 138 is located on the opposite side of transmission part 137 with respect to a virtual plane which includes rotation axis 102 and is perpendicular to rotation axis 101. Head end 138A of transmission part 138 is connected with base end 127B of connection part 127 opposite to frame 910 while base end 138B thereof is connected with vibrator part 148. Transmission part 138 intersects rotation axis 102, extends from head end 138A away from rotation axis 102, and intersect vibrator part 148.

In accordance with the embodiment, transmission part 137 and transmission part 138 are disposed in rotational symmetry to each other in which if one of them is rotated at 180 degrees about rotation axis 102 it becomes identical to the other; therefore, they are disposed in line symmetry. Transmission part 137 has a straight rod shape which extends from base end 127B of connection part 127 to vibrator part 147, that is, from head end 137A to base end 137B of transmission part 137. Transmission part 138 has a straight rod shape which extends from base end 127B of connection part 127 to vibrator part 148, that is, from head end 138A to base end 138B of transmission part 138. Opening 102S2 (space) containing rotation axis 102 therein is provided between transmission part 137 and transmission part 138. Opening 102S2 is located on rotation axis 102. In the case where transmission parts 137 and 138 have a rod shape thus extending on a straight line, transmission parts 137 and 138 efficiently transmit, to connection part 127, vibrations of vibrator parts 147 and 148 as torque. The angle of the direction in which each of transmission parts 137 and 138 extends with respect to rotation axis 102 may be not smaller than 15 degrees to not larger than 80 degrees. The shape of each of transmission parts 137 and 138 may be not only a straight line, but also a curved or bent one.

Vibrator parts 147 and 148 have arm shapes which vibrate in circumferential directions about rotation axis 102, thereby generating torque for rotationally vibrating frame 910. Vibrator parts 147 and 148 extend in intersecting directions D147 and D148 that intersect rotation axis 102, respectively. Vibrator part 147 is disposed on the same side of transmission part 137 with respect to rotation axis 102 in intersecting direction D147 that intersects rotation axis 102. Vibrator part 147 is connected with base end 137B of transmission part 137. Vibrator part 148 is disposed on the opposite side of transmission parts 137 with respect to rotation axis 102 in intersecting direction D148 that intersects rotation axis 102. Vibrator part 148 is connected with base end 138B of transmission part 138.

In accordance with the embodiment, vibrator part 147 has a rectangular rod shape that extends in a direction perpendicular to rotation axis 102. Vibrator part 148 has a rectangular rod shape that extends in the direction which is opposite to vibrator part 147 and which perpendicularly intersects rotation axis 102.

Connection portion 4149 couples base end 147B of vibrator part 147 unitarily with base end 148B of vibrator part 148 at connection position 4149P on connection portion 4149. Vibrator part 147 and vibrator part 148 constitute a single straight rod that extends from rotation axis 102 as a center in directions perpendicular to rotation axis 102. Base end 137B of transmission part 137 is connected with vibrator part 147 at a position between connection portion 4149 and driver part 157, that is, at a position between head end 147A and base end 147B of the vibrator part. Base end 138B of transmission part 138 is connected with vibrator part 148, at a position between connection portion 4149 and driver part 158, that is, at the position between head end 148A and base end 148B of the vibrator part. Both at least a part where transmission part 137 is connected with vibrator part 147 and at least a part where transmission part 138 is connected with vibrator part 148 are preferably disposed on outer sides from connection part 128, that is, are disposed preferably farther away from rotation axis 102 than the contour of connection part 128. This configuration allows vibrations of vibrator parts 147 and 148 to be effectively transmitted to transmission parts 137 and 138. In accordance with the embodiment, the entire of each of the parts at which transmission parts 137 and 138 are connected with vibrator parts 147 and 148 is disposed on the outer side from connection part 128, that is, farther away from rotation axis 102 than the contour of connection part 128. That is, the width of opening 102S2 in the direction perpendicular to rotation axis 102 is equal to the gap between base end 137B of transmission part 137 and base end 138B of transmission part 138, and is larger than the width of connection part 128 in the direction perpendicular to rotation axis 102. The width of opening 102S2 in the direction perpendicular to rotation axis 102 includes the width of connection part 128 in the direction perpendicular to rotation axis 102.

Driver parts 157 and 158 generate driving forces that cause head ends 147A and 148A of vibrator parts 147 and 148 to vibrate, respectively, in circumferential directions about rotation axis 102. Driver part 157 is connected with head end 147A of vibrator part 147, and causes vibrator part 147 to vibrate in the circumferential directions about rotation axis 102, which in turn causes, via transmission part 137, connection part 127 to vibrate rotationally about rotation axis 102. Driver part 158 is connected with head end 148A of vibrator part 148, and causes vibrator part 148 to vibrate in the circumferential directions about rotation axis 102, which in turn causes, via transmission part 138, connection part 127 to swing rotationally about rotation axis 102.

In accordance with the embodiment, base end 157B of driver part 157 is connected unitarily with head end 147A of vibrator part 147, and driver part 157 includes driver body 195 extending along rotation axis 102 toward frame 910.

Driver body 195 has a rod shape with a rectangular cross-section. Driver body 195 includes head end 195A and base end 195B, and extends from head end 195A to base end 195B, namely from base end 195B to head end 195A. Head end 157A and base end 157B of driver part 157 are identical to head end 195A and base end 195B of driver body 195, respectively. Piezoelectric element 196 having a sender plate shape is disposed on the surface of driver body 195 along rotation axis 102. A voltage which periodically changes and is applied to piezoelectric element 196 causes piezoelectric element 196 to repetitively expand and contract alternately. In response to the expansion and contraction of piezoelectric element 196, driver body 195 (driver part 157) warps and recovers repetitively. Head end 195A of driver body 195 protruding more largely than base end 195B connected with vibrator part 147 vibrates more greatly than base end 195B. Then, vibration energy of the entire of driver body 195 (driver part 157) is transmitted to head end 147A of vibrator part 147.

Similarly to driver part 157, driver part 158 includes driver body 197 and piezoelectric element 198, and is disposed at a position symmetrical to driver part 157 with respect to the virtual plane which includes rotation axis 102 and which perpendicularly intersects rotation axis 101. Driver part 158 operates similarly to driver part 157.

That is, base end 158B of driver part 158 is connected unitarily with head end 148A of vibrator part 148, and driver part 158 includes driver body 197 extending along rotation axis 102 toward frame 910. Driver body 197 has a rod shape with a rectangular cross-section. Driver body 197 includes head end 197A and base end 197B, and extends from head end 197A to base end 197B, namely from base end 197B to head end 197A. Head end 158A and base end 158B of driver part 158 are identical to head end 197A and base end 197B of driver body 197, respectively. Piezoelectric element 198 having a slender plate shape is disposed on the surface of driver body 197 along rotation axis 102. A voltage which changes and which is applied to piezoelectric element 198 causes piezoelectric element 198 to repetitively expand and contract alternately. In response to the expansion and contraction of piezoelectric element 198, driver body 197 (driver part 158) warps and recovers repetitively. Driver body 197 (driver part 158) operates as follows: Head end 197A protruding more largely than base end 197B connected with vibrator part 148 vibrates more greatly than base end 197B. Then, vibration energy of the entire of driver body 197 (driver part 158) is transmitted to head end 148A of vibrator part 148.

In accordance with the embodiment, each of piezoelectric elements 196 and 198 is a thin-film laminated piezoelectric actuator which is formed on the surface of corresponding one of drive bodies 195 and 197. The actuator has a laminated body structure in which electrodes and a piezoelectric body are laminated, on one another in a thickness direction. This configuration further reduces the thicknesses of driver parts 157 and 158.

Driver parts 157 and 158 are not limited to the parts that vibrate due to strains of piezoelectric elements 196 and 198, and may be of another type. For example, each of the driver parts may be equipped with a member, device, or the like capable of generating a force due to interaction between a magnetic field and an electric field, thereby causing the driver parts to vibrate. Such a force is generated in a way as follows: At least one of a magnetic field and electric field produced by an external device is caused to vary, or at least one of a magnetic field and electric field produced by the member, device, or the like changes, which thereby generates the force. Moreover, examples of the material configuring the piezoelectric body include a piezoelectric material, such as lead zirconate titanate (PZT), having a high piezoelectric constant.

Base 164 is used to attach reflective optical element 300 to an external structural member and the like. Base 164 is connected with connection part 128 that is used to couple parts 147 and 148 with base 164 vibratably with respect to base 164.

Connection part 128 is disposed along rotation axis 102. Base end 128B of connection part 128 is connected with base 164 while head end 128A thereof is connected with both base end 147B of vibrator part 147 and base end 148B of vibrator part 148.

The shape of connection part 128 is not particularly limited; however, connection part 128 has a rod shape with a width equal to or larger than that of connection part 127 since connection part 128 per se is intended to twist per se, thereby effectively transmitting the vibration of vibrator parts 147 and 148 to connection part 127 as torque via transmission parts 137 and 138. Connection part 128 has a rectangular cross-section perpendicular to rotation axis 102. Connection part 128 has the same thickness as connection part 127 and other portions. Thus, the width (the length in the Y-axis direction in the figure) of connection part 128 is larger than that of connection part 127. Connection part 128 has the same cross-sectional shape over a region from base 164 to vibrator parts 147 and 148, that is, from base end 128B to head end 128A. Similarly to connection part 126, this configuration avoids concentration of stresses, thereby preventing connection part 128 from being broken due to the concentration. The torsional rigidity of connection part 127 is smaller than that of connection part 128 under the condition that both have the same length in the direction of rotation axis 102.

Similarly to connection part 127, connection part 128 is not necessarily straight along rotation axis 102; it may be curved meanderingly or bent in a zigzag.

Monitor elements 177 and 178 are attached to transmission parts 137 and 138 so as to detect, as strains, the states of warpage of transmission parts 137 and 138, respectively. In particular, in order to transmit torque to connection part 127, transmission parts 137 and 138 having rod shapes extending straight warp in the thickness direction (Z-axis direction) almost without twisting. This configuration allows monitor elements 177 and 178 to detect the warpages of transmission parts 137 and 138 accurately. Therefore, monitor elements 177 and 178 correctly monitor the state of rotational vibration of frame 910.

In accordance with the embodiment, monitor elements 177 and 178 are attached to transmission parts 137 and 138, respectively. Monitor elements 177 and 178 are connected with detection circuit 901. Detection circuit 901 differentially detects output signals from two monitor elements 177 and 178 as well as the output signals from monitor elements 171 and 172. That is, the detection circuit detects a difference between the output signals from monitor elements 177 and 178. Specifically, detection circuit 901 generates a differential signal based on both a signal that is obtained through the differential detection of the output signals from two monitor elements 175 and 176 and a signal that is obtained through the differential detection of the output signals from two monitor elements 177 and 178. This operation causes various noises in the output signals to cancel out each other, thereby monitoring the state of rotational vibration of frame 910 accurately. This configuration makes the monitoring result worth being fed back to control driver parts 157 and 158. Specifically, in accordance with the differential signal, detection circuit 901 controls the voltage applied to piezoelectric elements 196 and 198, thereby controlling the amplitudes of vibrations of driver parts 157 and 158.

In reflective optical element 300 according to Embodiment 3, driver parts 157 and 158 are driven in opposite phases in directions opposite to each other, and cause vibrator parts 147 and 148 to vibrate in opposite phases, thereby generating torque in the same rotation direction about rotation axis 102. Transmission parts 137 and 138 separately disposed on respective sides of rotation axis 102, and transmit the torque to base end 127B of connection part 127 without cancelling out the torque between transmission parts 137 and 138, thereby efficiently transmitting the torque. This configuration increases the deflection angle of frame 910 which rotationally vibrates even when driver parts 157 and 158 are driven at high frequencies. This configuration increases the deflection angle of reflector 110 also even when the voltage applied to piezoelectric elements 196 and 198 is low. That is, this configuration provides reflective optical element 300 with preferable deflection angle characteristics.

In reflective optical element 300 according to Embodiment 3, connection parts 127 and 128, driver parts 157 and 158, and vibrator parts 147 and 148 face connection parts 125 and 126, driver parts 155 and 156, and vibrator parts 145 and 146 across rotation axis 101, respectively.

In addition to the advantages described in Embodiments 1 and 2, reflective optical element 300 according to Embodiment 3 has other advantages that reflector 110 swinging rotationally about rotation axis 101 by rotational vibration mechanisms 201 and 202 swings further rotationally about rotation axis 102 that intersects reflector 110. Therefore, even in cases where only one laser light beam is to be reflected, for example, this configuration provides two-dimensional scan of a position irradiated with the laser light beam.

In each of Embodiments 1 and 2, rotation axis 101 passes approximately through the center of reflector 110. Such configuration causes the center of reflector 110 to act as a steady point which does not move. Thus, incident light on the steady point is reflected off it and travels through a steady light path, which allows precise scanning.

In accordance with the embodiments, rotation axis 101 intersects rotation axis 102 perpendicularly approximately at the center of reflector 110. This configuration causes the center of reflector 110 to act as a steady point which does not move. In cases where reflective optical element 300 is used in a projector and the like, incident light on the steady point is reflected off it and travels through a steady light path to be projected on a screen, which allows the precise projection of images.

Reflective optical element 300 may further include projection parts protruding from respective driver parts 153 to 158 similarly to projection parts 301 and 302 of reflective optical element 100A shown in FIG. 3, providing the same advantages.

In each of Embodiments 1 to 3, a pair of the vibrator parts and a pair of the driver parts constitute a tuning fork shape as a whole. The pair of the vibrator parts and the pair of the driver parts surround reflector 110. This arrangement reduces the size of reflective optical element 300. Both the head ends of the vibrator parts and the head ends of driver parts act as free ends, and increases the deflection angle of reflector 110, and so that a large vibration energy can be caused by a small energy. However, that the present disclosure is not limited to Embodiments 1 to 3 described above. For example, the vibrator part and the driver part may constitute a single rod shape.

For example, rotational vibration mechanisms 201 and 202 are disposed in plane symmetry and such that rotational vibration mechanisms 203 and 204 are disposed in plane symmetry, they may be disposed in rotational symmetry.

Moreover, although the piezoelectric element is formed only on one side of each of the drive bodies, piezoelectric elements may be formed on both sides of each of them. Furthermore, piezoelectric elements may be formed also on the surfaces of the vibrator parts.

INDUSTRIAL APPLICABILITY

Reflective optical elements according to the present disclosure have advantages, have small size. Such advantages make these elements usable in applications as diverse as compact display devices, compact projectors, automotive head-up display devices, electrophotographic copying machines, laser-beam printers, optical scanners, and optical radars, for example.

REFERENCE MARKS IN THE DRAWINGS 100, 100A, 200, 300 reflective optical element
101 rotation axis (first rotation axis)
102 rotation axis (second rotation axis)
110 reflector
111 reflection surface
121 connection part (first connection part)
122 connection part (second connection part)
123 connection part (third connection part)
124 connection part (fourth connection part)
125 connection part (fifth connection part)
126 connection part (sixth connection part)
127 connection part (seventh connection part)
128 connection part (eighth connection part)
131 transmission part (first transmission part)
132 transmission part (second transmission part)
133 transmission part (third transmission part)
134 transmission part (fourth transmission part)
135 transmission part (fifth transmission part)
136 transmission part (sixth transmission part)
137 transmission part (seventh transmission part)
138 transmission part (eighth transmission part)
141 vibrator part (first vibrator part)
142 vibrator part (second vibrator part)
143 vibrator part (third vibrator part)
144 vibrator part (fourth vibrator part)
145 vibrator part (fifth vibrator part)
146 vibrator part (sixth vibrator part)
147 vibrator part (seventh vibrator part)
148 vibrator part (eighth vibrator part)
1149 coupling part
2149 coupling part
151 driver part (first driver part)
152 driver part (second driver part)
153 driver part (third driver part)
154 driver part (fourth driver part)
155 driver part (fifth driver part)
156 driver part (sixth driver part)
157 driver part (seventh driver part)
158 driver part (eighth driver part)
161 base (first base)
162 base (second base)
163 base (third base)

164 base (fourth base)
171 monitor element (first monitor element)
172 monitor element (second monitor element)
173 monitor element (third monitor element)
174 monitor element (fourth monitor element)
175 monitor element (fifth monitor element)
176 monitor element (sixth monitor element)
177 monitor element (seventh monitor element)
178 monitor element (eighth monitor element)
183, 184 driver body
185, 186 piezoelectric element
187, 188 driver body
189, 190 piezoelectric element
191 driver body (fifth driver body)
192 piezoelectric element (fifth piezoelectric element)
193 driver body (sixth driver body)
194 piezoelectric element (sixth piezoelectric element)
195 driver body (seventh driver body)
196 piezoelectric element (seventh piezoelectric element)
197 driver body (eighth driver body)
198 piezoelectric element (eighth piezoelectric element)
201 to 204 rotational vibration mechanism

The invention claimed is:

1. A reflective optical element comprising:
a reflector configured to vibrate rotationally about a first rotation axis, the reflector being configured to reflect light;
a first connection part disposed along the first rotation axis, the first connection part having a base end and a head end which is connected with the reflector;
a first transmission part having a base end and a head end which is connected with the base end of the first connection part, the first transmission part extending from the head end of the first transmission part away from the first rotation axis, the first transmission part configured to transmit torque to the first connection part;
a second transmission part having a based end and a head end which is connected with the base end of the first connection part, the second transmission part extending from the head end of the second transmission part away from the first rotation axis on an opposite side of the first transmission part with respect to the first rotation axis, the second transmission part being configured to transmit torque to the first connection part;
a first vibrator part connected with the base end of the first transmission part and having a head end and a base end, the first vibrator part disposed along a first intersecting direction which intersects the first rotation axis, the first vibrator part being disposed in a same side of the first transmission part with respect to the first rotation axis;
a second vibrator part connected with the base end of the second transmission part and having a head end and a base end, the second vibrator part disposed along a second intersecting direction which intersects the first rotation axis, the second vibrator part being disposed on an opposite side of the first transmission part with respect to the first rotation axis;
a first driver part connected with the head end of the first vibrator part, the first driver part being configured to rotationally swing the first connection part via the first vibrator part and the first transmission part;
a second driver part connected with the head end of the second vibrator part, the second driver part being rotationally swing the first connection part via the second vibrator part and the second transmission part;
a first base; and
a second connection part connecting the first vibrator part and the second vibrator part vibratably with the first base.

2. The reflective optical element of claim 1, further comprising a first monitor element configured to detect strain on the first transmission part, at least a part of the first monitor element being attached to the first transmission part.

3. The reflective optical element of claim 2, further comprising
a second monitor element configured to detect strain on the second transmission part, at least a part of the second monitor element being attached to the second transmission part,
wherein an output of the first monitor element and an output of the second monitor element are configured to be differentially detected.

4. The reflective optical element of claim 1, further comprising:
a third connection part disposed along the first rotation axis on an opposite side of first connection part with respect to the reflector, the third connection part having a base end and a head end which is connected with the reflector;
a third transmission part having a base end and a head end which is connected with the base end of the third connection part, the third transmission part extending from the head end of the third transmission part away from the first rotation axis, the third transmission part configured to transmit torque to the third connection part;
a fourth transmission part having a base end and a head end which is connected with the base end of the third connection part, the fourth transmission part extending from the head end of the third transmission part away from the first rotation axis on an opposite side of the third transmission part with respect to the first rotation axis, the fourth transmission part being configured to transmit torque to the third connection part;
a third vibrator part connected with the base end of the third transmission part and having a head end and a base end, the third vibrator part being disposed along a third intersecting direction which intersects the first rotation axis, the third vibrator part being disposed on a same side of the third transmission part with respect to the first rotation axis;
a fourth vibrator part connected with the base end of the fourth transmission part and having a head end and a base end, the fourth vibrator part being disposed along a fourth intersecting direction which intersects the first rotation axis on an opposite side of the third transmission part with respect to the first rotation axis;
a third driver part connected with the head end of the third vibrator part, the third driver part being configured to rotationally swing the third connection part via the third vibrator part and the third transmission part;
a fourth driver part connected with the head end of the fourth vibrator part, the fourth driver part being configured to rotationally swing the third connection part via the fourth vibrator part and the fourth transmission part;
a second base; and
a fourth connection part connecting both the third vibrator part and the fourth vibrator part vibratably with the second base.

5. The reflective optical element of claim 4, further comprising:

a first monitor element configured to detect strain on the first transmission part, at least a part of the first monitor element being attached to the first transmission part;
a second monitor element configured to detect strain on the second transmission part, at least a part of the second monitor element being attached to the second transmission part;
a third monitor element configured to detect strain on the third transmission part, at least a part of the third monitor element being attached to the third transmission part; and
a fourth monitor element configured to detect strain on the fourth transmission part, at least a part of the fourth monitor element being attached to the fourth transmission part,
wherein an output of the first monitor element, an output of the second monitor element, an output of the third monitor element, and an output of the fourth monitor element are configured to be differentially detected.

6. The reflective optical element of claim 5, wherein
the first monitor element contains piezoelectric material,
the first driver part includes a first piezoelectric element containing piezoelectric material,
the second driver part includes a second piezoelectric element containing piezoelectric material, and
the piezoelectric material of the first monitor element is identical to the piezoelectric material of the first piezoelectric element and the piezoelectric material of the second piezoelectric element.

7. The reflective optical element of claim 1, further comprising:
a fifth connection part disposed along a second rotation axis extending in a direction which intersects the first rotation axis, the fifth connection part having a base end and a head end which is connected with the first base;
a fifth transmission part having a base end and a head end which is connected with the base end of the fifth connection part, the fifth transmission part extending from the head end of the fifth transmission part away from the second rotation axis, the fifth transmission part being configured to transmit torque to the fifth connection part;
a sixth transmission part having a base end and a head end which is connected with the base end of the fifth connection part, the sixth transmission part extending from the head end of the sixth transmission part away from the second rotation axis on an opposite side of the fifth transmission part with respect to the second rotation axis, the sixth transmission part being configured to transmit torque to the fifth connection part;
a fifth vibrator part connected with the base end of the fifth transmission part and having a head end and a base end, the fifth vibrator part being disposed along a fifth intersecting direction which intersects the second rotation axis, the fifth vibrator part being disposed in a same side of the fifth transmission part with respect to the second rotation axis;
a sixth vibrator part connected with the base end of the sixth transmission part and having a head end and a base end, the sixth vibrator part being disposed along a sixth intersecting direction which intersects the second rotation axis on an opposite side of the fifth transmission part with respect to the second rotation axis;
a fifth driver part connected with the head end of the fifth vibrator part, the fifth driver part being configured to rotationally swing the fifth connection part via the fifth vibrator part and the fifth transmission part;
a sixth driver part connected with the head end of the sixth vibrator part, the sixth driver part being configured to rotationally swing the fifth connection part via the sixth vibrator part and the sixth transmission part;
a third base; and
a sixth connection part connecting the fifth vibrator part and the sixth vibrator part vibratably with the third base.

8. The reflective optical element of claim 7, further comprising:
a seventh connection part disposed along the second rotation axis on an opposite side of the fifth connection part with respect to the reflector, the seventh connection part having a base end and a head end which is connected with the first base;
a seventh transmission part having a base end and a head end which is connected with the base end of the seventh connection part, the seventh transmission part extending from the head end of the seventh transmission part away from the second rotation axis, the seventh transmission part being configured to transmit torque to the seventh connection part;
an eighth transmission part having a base end and a head end which is connected with the base end of the seventh connection part, the eighth transmission part extending from the head end of the eighth transmission part away from the second rotation axis on an opposite side of the seventh transmission part with respect to the second rotation axis, the eighth transmission part being configured to transmit torque to the seventh connection part;
a seventh vibrator part connected with the base end of the seventh transmission part and having a head end and a base end, the seventh vibrator part being disposed along a seventh intersecting direction which intersects the second rotation axis, the seventh vibrator part being disposed in a same side of the seventh transmission part with respect to the second rotation axis;
an eighth vibrator part connected with the base end of the eighth transmission part and having a head end and a base end, the eighth vibrator part being disposed along an eighth intersecting direction which intersects the second rotation axis on an opposite side of the seventh transmission part with respect to the second rotation axis;
a seventh driver part connected with the head end of the seventh vibrator part, the seventh driver part being configured to rotationally swing the seventh connection part via the seventh vibrator part and the seventh transmission part;
an eighth driver part connected with the head end of the eighth vibrator part, the eighth driver part being configured to rotationally swing the seventh connection part via the eighth vibrator part and the eighth transmission part;
a fourth base; and
an eighth connection part connecting both the seventh vibrator part and the eighth vibrator part vibratably with the fourth base.

9. The reflective optical element of claim 1, wherein the first transmission part and the second transmission part are in rotational symmetry to each other with respect to the first rotation axis.

10. The reflective optical element of claim 1, wherein
the first transmission part has a rod shape extending from the base end of the first connection part to the first vibrator part, and the second transmission part has a rod shape extending from the base end of the first connection part to the second vibrator part.

11. The reflective optical element of claim 1, wherein the base end of the first vibrator part is connected with the base end of the second vibrator part at a connection position, the base end of the first transmission part is connected with the first vibrator part at a position away from the connection position, and the base end of the second transmission part is connected with the second vibrator part at a position away from the connection position.

12. The reflective optical element of claim 1, wherein the first connection part has less torsional rigidity than the second connection part.

13. The reflective optical element of claim 1, further comprising:

a first projection part protruding from a portion of the first driver part opposite to the head end of the first vibrator part; and a second projection part protruding from a portion of the second driver part opposite to the head end of the second vibrator part.

* * * * *